United States Patent
Akahori et al.

(10) Patent No.: US 6,215,087 B1
(45) Date of Patent: Apr. 10, 2001

(54) PLASMA FILM FORMING METHOD AND PLASMA FILM FORMING APPARATUS

(75) Inventors: Takashi Akahori, Hachioji; Masaki Tozawa, Fussa; Yoko Naito, Sagamihara; Risa Nakase, Sagamihara; Osamu Yokoyama, Sagamihara; Shuichi Ishizuka, Kanagawa-ken; Shunichi Endo, Sagamihara; Masahide Saito, Setagawa-Ku; Takeshi Aoki, Hachioji; Tadashi Hirata, Sagamihara, all of (JP)

(73) Assignee: Tokyo Electron Limited, Tokyo-to (JP)

( * ) Notice: Subject to any disclaimer, the term of this patent is extended or adjusted under 35 U.S.C. 154(b) by 0 days.

(21) Appl. No.: 09/101,516
(22) PCT Filed: Nov. 11, 1997
(86) PCT No.: PCT/JP97/04098
§ 371 Date: Jul. 10, 1998
§ 102(e) Date: Jul. 10, 1998
(87) PCT Pub. No.: WO98/21747
PCT Pub. Date: May 22, 1998

(30) Foreign Application Priority Data

Nov. 14, 1996 (JP) .................................. 8-320911

(51) Int. Cl.[7] .................................. B23K 10/00
(52) U.S. Cl. .................. 219/121.43; 219/121.42; 204/298.02; 204/298.12
(58) Field of Search .................. 219/121.4, 121.41, 219/121.43, 121.42; 204/298.12, 298.37, 298.38, 298.02; 156/345, 643.1, 646.1; 118/723 R

(56) References Cited

FOREIGN PATENT DOCUMENTS

| | | |
|---|---|---|
| 61-218134 | 9/1986 | (JP) . |
| 62-43335 | 12/1987 | (JP) . |
| 63-233549 | 9/1988 | (JP) . |
| 3-3380 | 1/1991 | (JP) . |
| 4-271122 | 9/1992 | (JP) . |
| 6-196421 | 7/1994 | (JP) . |
| 6-216047 | 8/1994 | (JP) . |
| 7-278822 | 10/1995 | (JP) . |
| 8-83842 | 3/1996 | (JP) . |

OTHER PUBLICATIONS

H. Kudo, et al., "Characteristics of Plasma–CF films for Very Low–k Dielectrics".
S.Takeishi, et al., "Fluorocarbon Films Deposited by PECVD with High Thermal Resistance and Low Dielectric Constants".
W. Lee, et al., "Plasma Polymerization of Low Dielectric Constant Fluorocarbon Polymer by ECR".

(List continued on next page.)

Primary Examiner—Mark Paschall
(74) Attorney, Agent, or Firm—Smith, Gambrell & Russell, LLP

(57) ABSTRACT

Microwave is introduced into a plasma chamber of a plasma processing apparatus and magnetic field is applied thereto to allow plasma generation gas to be placed in plasma state by the electron cyclotron resonance. This plasma is introduced into a film forming chamber of the plasma processing apparatus to allow film forming gas including compound gas of carbon and fluorine or compound gas of carbon, fluorine and hydrogen, and hydro carbon gas to be placed in plasma state. In addition, an insulating film consisting of fluorine added carbon film is formed by the film forming gas placed in plasma state.

7 Claims, 22 Drawing Sheets

OTHER PUBLICATIONS

K. Endo, et al., "Effect of Bias Addition on the Gap–Filling Properties of Fluorinated Amorphous Carbon Thin Films Grown by Helicon Wave Plasma Enhanced Chemical Vapor Deposition".

Endo et al., Fluorinated amorphous carbon thin films grown by helicon plasma enhanced chemical vapor deposition for low dielectric constant interlayer dielectrics, Applied Physics Letters vol. 68, No. 20, May 13, 1996, pp. 2864–2866.

Sah, Mass Spectrometric Study of Gas Evolution From Plasma–Deposited Fluorohydrogenated Amorphous Carbon Films on Heating, Thin Solid Films, vol. 167 (1988), pp. 255–260.

Grill et al., Wear Resistant Fluorinated Diamondlike Carbon Films, Diamond Films and Technology, vol. 6, No. 1, (1966) pp. 13–21.

Thin Film Handbook (in Japanese), Dec. 10, 1983, p. 229.

| BIAS POWER (W) | FILM FORMING SPEED (Å/min) | | | |
| --- | --- | --- | --- | --- |
| | 0.2Pa | 1Pa | 2Pa | 10Pa |
| 0 | 5500 | 4500 | 4000 | 1000 |
| 500 | 5350 | 3500 | 2300 | 0 (300W) |
| 1000 | 4500 | 2200 | 1500 | — |
| 1500 | 3300 | 1000 | 0 | — |

| PRESSURE (Pa) | STRESS (dynes/cm$^2$) | FILM PEELING TEST |
|---|---|---|
| 0.2 | $-1.2 \times 10^8$ (COMPRESSION) | NO PEELING |
| 1.0 | $-6.9 \times 10^7$ (COMPRESSION) | NO PEELING |
| 1.2 | $1.1 \times 10^8$ (TENSILE) | NO PEELING |
| 1.5 | $1.9 \times 10^8$ (TENSILE) | PEELING |
| 2 | $3.0 \times 10^8$ (TENSILE) | PEELING |
| 10 | IMPOSSIBILITY IN MEASUREMENT | ALREADY PEELED OFF AT TIME OF FILM FORMATION |

FIG.13

| BIAS POWER (W) | ASPECT RATIO | | | | | |
|---|---|---|---|---|---|---|
| | 0.8 | 1.0 | 1.5 | 2.0 | 1.5 | 3.0 |
| 0 | × | × | × | × | × | × |
| 500 | ○ | × | × | × | × | × |
| 1000 | ○ | ○ | ○ | × | × | × |
| 1500 | ○ | ○ | ○ | ○ | × | × |
| 2000 | ○ | ○ | ○ | ○ | ○ | ○ |
| 2500 | ○ | ○ | ○ | ○ | ○ | ○ |

FIG.19

PLASMA FILM FORMING METHOD AND PLASMA FILM FORMING APPARATUS

TECHNICAL FIELD

This invention relates to a method and an apparatus for forming, by plasma processing, fluorine added carbon film which can be used in interlayer insulating film of, e.g., a semiconductor device.

BACKGROUND ART

In order to realize high integration of the semiconductor device, methods such as miniaturization of pattern and/or multi-layer of circuit are being developed. Among these devices, there is the technology for allowing wiring to be of multi-layer. In order to achieve a multi-layer wiring structure, a conductive layer is connected between the n-th wiring layer and the (n+1)-th wiring layer, and a thin film called interlayer insulating film is formed within the area except for the conductive layer.

A typical interlayer insulating film $SiO_2$ film. In order to allow the operation of the device to have higher speed in recent years, it is required to lower the specific dielectric constant of the interlayer insulating film. Studies with respect to material of the interlayer insulating film are being conducted. Namely, the specific dielectric constant of $SiO_2$ is approximately 4 and studies have focused on the development of material having a specific dielectric constant smaller than that. Realization of SiOF having specific dielectric constant of 3.5 is being developed as one of them. The inventors of this application pay attention to fluorine added carbon film having a smaller specific dielectric constant.

Meanwhile, for the interlayer insulating film, high adhesiveness (adhesion), large mechanical strength and excellent thermal stability, etc. are required in addition to small specific dielectric constant. As fluorine added carbon, trade name Teflon (polytetrafuloroethylene) is well known. However, this material has extremely bad adhesive property and has small hardness. Accordingly, even if there is employed such an approach that fluorine added carbon film is used as an interlayer insulating film, there are many unknown portions in the film property (quality). In the present state, such material is difficult to be put into practical use.

DISCLOSURE OF THE INVENTION

This invention has been made under such circumstances and its object is to provide a method and an apparatus for manufacturing fluorine added carbon suitable for a semiconductor device.

This invention provides a plasma film forming method comprising the steps of: allowing film forming gas including compound gas of carbon and fluorine and hydro-carbon gas to be placed in plasma state; and forming an insulating film consisting of fluoride added carbon film on an object to be processed by the plasma.

This invention further provides a plasma film forming method comprising the steps of: introducing microwave of 10 kw or more per unit volume of 1 cubic meters within vacuum atmosphere into a plasma chamber of a plasma processing unit and of applying magnetic field thereto to allow plasma generation gas to be placed in plasma state by the electron cyclotron resonance; introducing the plasma into a film forming chamber of the plasma processing unit to allow film forming gas including compound gas of carbon and fluorine or compound gas of carbon, fluorine and hydrogen gen and hydro carbon gas to be placed in plasma state; and forming an insulating film consisting of fluorine added carbon film by the film forming gas placed in plasma state.

This invention further provides a plasma film forming method comprising the steps of: allowing film forming gas including compound gas of carbon and fluorine or compound gas of carbon, fluorine and hydrogen, and hydro carbon gas to be placed in plasma state within a vacuum vessel provided with a mounting table of an object to be processed; and applying, to the mounting table, bias power of 3.14 $W/cm^2$ or more per unit area of the mounting surface of the mounting table to form an insulating film consisting of fluorine added carbon film on the object to be processed by the plasma while drawing ions in plasma into the object to be processed.

This invention further provides a plasma film forming method comprising the steps of: allowing processing gas including compound gas of carbon and fluorine or compound gas of carbon, fluorine and hydrogen, and oxygen plasma generation gas to be placed in plasma state; and forming an insulating film consisting of fluorine added carbon film onto an object to be processed by the plasma.

This invention further provides a plasma film forming method comprising the steps of: allowing film forming gas including compound gas of carbon and fluorine or compound gas of carbon, fluorine and hydrogen to be placed in plasma state to form an insulating film consisting of fluorine added carbon film on an object to be processed by the plasma; generating oxygen plasma after undergone switching from the film forming gas to oxygen plasma generation gas to etch a portion of the insulating film by this oxygen plasma; and generating plasma after undergone switching from oxygen plasma to the film forming gas to form an insulating film consisting of fluorine added carbon film on an object to be processed by this plasma.

This invention further provides a plasma film forming method comprising: applying a.c. power to processing gas to generate plasma; and forming a thin film on an object to be processed by the plasma while allowing the a.c. power by pulse having a frequency lower than frequency of the a.c. power to be turned on or off.

This invention further provides a plasma processing apparatus comprising: a plasma chamber for allowing plasma generation gas to be placed in plasma state; a first generator for generating microwave within the plasma chamber; a forming element for forming magnetic field within the plasma chamber; a first supply unit for supplying the plasma generation gas into the plasma chamber; a film forming chamber for forming an insulating film on an object to be processed; and a second supply unit for supplying film forming gas including compound gas of carbon and fluorine or compound gas of carbon, fluorine and hydrogen and hydro carbon gas into the film forming chamber, whereby the generation gas placed in plasma state by the electron cyclotron resonance by the microwave and the magnetic field is introduced into the film forming chamber so that the film forming gas is placed in plasma state, and an insulating film consisting of fluorine added carbon film is formed by the film forming gas placed in plasma state.

BRIEF DESCRIPTION OF THE DRAWINGS

FIG. 13 is an explanatory view showing the relationship between process pressure and stress of CF film;

FIG. 19 is an explanatory view showing the relationship between bias power and aspect ratio of embeddable recessed portion.

BEST MODE FOR CARRYING OUT THE INVENTION

Figure 1:
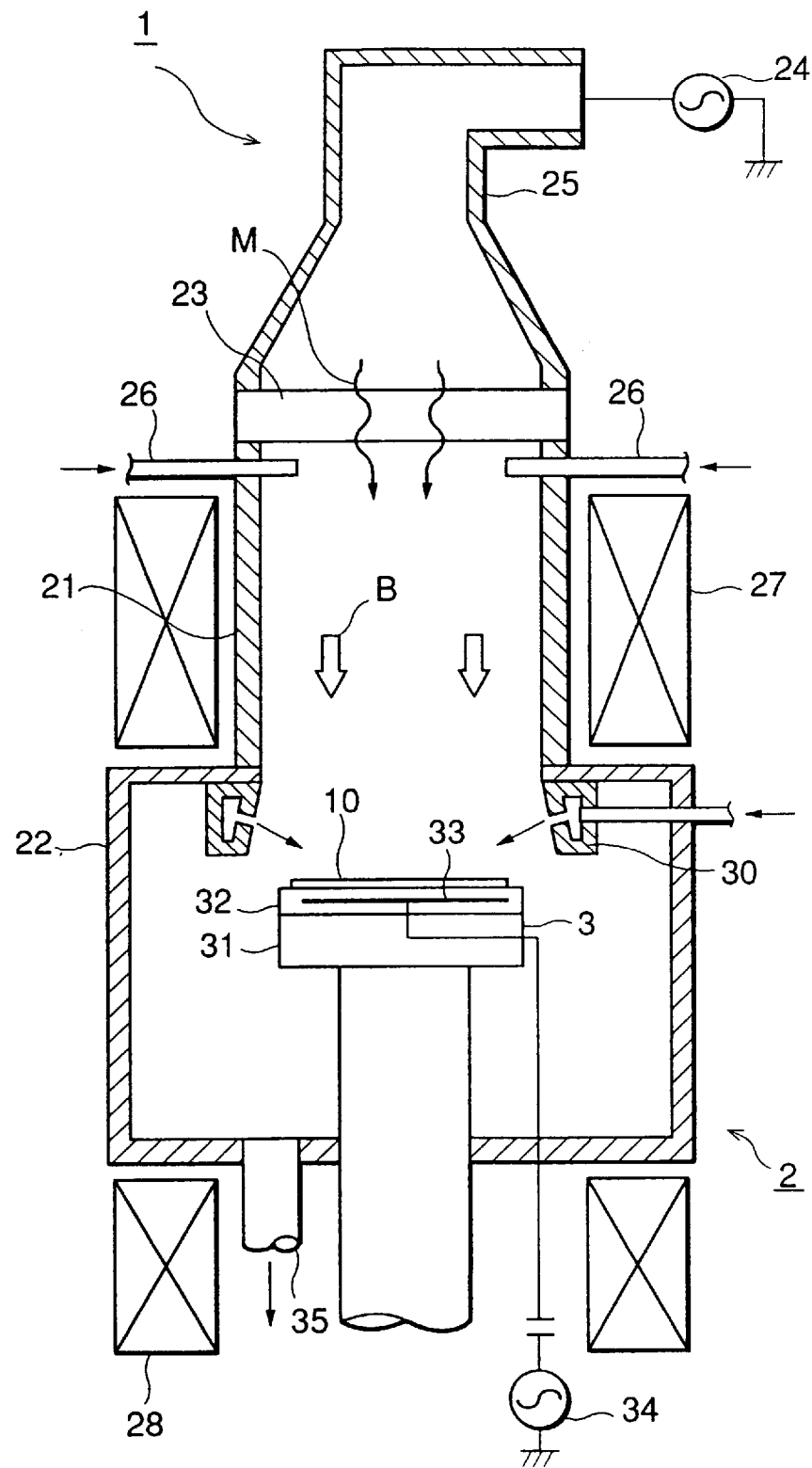
FIG. 1 is a longitudinal side cross sectional view showing an example of a plasma processing apparatus used for carrying out a plasma film forming method of this invention.

The embodiment of this invention is characterized in that an approach is employed to examine the relationship with respect to the process condition for manufacturing fluorine added carbon (hereinafter referred to as "CF film") suitable for interlayer insulating film of, e.g., a semiconductor device, e.g., the relationship between kind or pressure, etc. of material gas and film quality of the CF film to find out optimum process condition. Initially, an example of a plasma processing apparatus used in this embodiment is shown in FIG. 1. As shown, this plasma processing apparatus 1 includes, e.g., a vacuum vessel 2 formed by, e.g., aluminum, etc., and is composed of a tubular plasma chamber 21 positioned at the upper portion of this vacuum vessel 2 and adapted for generating plasma, and a tubular film forming chamber 22 connected in a manner to communicate with the lower portion thereof and having aperture greater than that of the plasma chamber 21. In this example, this vacuum vessel 2 is grounded so that zero potential is provided.

The upper end of this vacuum vessel 2 is opened and a member for allowing microwave to be transmitted therethrough, e.g., a transmission window 23 formed by material such as quartz, etc. is air-tightly provided at this portion to maintain vacuum state within the vacuum vessel 2. At the outside of this transmission window 23, there is provided, e.g., a wave-guide (tube) 25 connected to a high frequency power supply section 24 as plasma generation high frequency supply means of 2.45 GHz, and is adapted so as to guide microwave M generated at the high frequency power supply section 24 via the wave-guide (tube) 25 to introduce it into the plasma chamber 21 from the transmission window 23.

At the side walls which partition the plasma chamber 21, there are provided plasma gas nozzles 26 equally disposed along its circumferential direction, for example. Plasma gas source (not shown), e.g., Ar gas or $O_2$ gas source is connected to these nozzles 26 so as to have ability to equally deliver, without unevenness, plasma gas such as Ar gas or $O_2$ gas, etc. into the upper portion within the plasma chamber 21. In this example, although only two nozzles 26 are described for the purpose of avoiding complexity of the drawings, more than two nozzles are provided in practice.

Moreover, at the outer circumference of the side wall which partitions the plasma chamber 21, e.g., a ring-shaped main electromagnetic coil 27 is disposed as magnetic field forming means in a manner close thereto, and a ring-shaped auxiliary electromagnetic coil 28 is disposed at the lower side of the film forming chamber 22, thus to have ability to form magnetic field directed from the upper side toward the lower side extending over the film forming chamber 22 from the plasma chamber 21, e.g., magnetic field B of 875 Gauss. Thus, the ECR plasma condition is satisfied. In this example, a permanent magnet may be used in place of the electromagnetic coil.

By forming microwave M and magnetic field B which have been frequency-controlled within the plasma chamber 21 in this way, the ECR plasma is generated by interaction therebetween. At this time, resonance action is produced in the introduced gas at the above-mentioned frequency. Thus, plasma can be formed at high density. Namely, this apparatus constitutes electron cyclotron resonance (ECR) plasma processing apparatus.

On the other hand, at the portion communicating with the upper portion of the film forming chamber 22, i.e., the plasma chamber 21, there is provided a ring-shaped film forming gas supply section 30 so that film forming gas is ejected from the inner circumferential surface. Moreover, a mounting table 3 is vertically movably provided within the film forming chamber 22. In this mounting table 3, an electrostatic chuck 32 including heater therewithin is provided on, e.g., a body 31 of aluminum. For example, a high frequency power supply section 34 is connected to an electrode 33 of the electrostatic chuck 32 in a manner to apply bias voltage for withdrawing ions onto wafer W. In addition, an exhaust pipe 35 is connected to the bottom portion of the film forming chamber 22.

A method of forming interlayer insulating film consisting of CF film on a wafer 10 which is the object to be processed by using the above-described apparatus will now be described. Initially, gate valve (not shown) provided at the side wall of the vacuum vessel 2 is opened to carry the a wafer 10 which is the object to be processed in which aluminum wiring is formed, e.g., on the surface from load lock chamber (not shown) to mount it on the mounting table 3.

Subsequently, after this gate valve is closed to tightly close the inside thereafter to exhaust the internal atmosphere from the exhaust pipe 35 to vacuum-evacuate it until a predetermined degree of vacuum to introduce plasma generation gas, e.g., Ar gas into the plasma chamber 21 from the plasma gas nozzles 26, and to introduce film forming gas, e.g., $CF_4$ gas and $C_2H_4$ gas under the condition of flow rates of 60 sccm and 30 sccm, respectively, into the film forming chamber 22 from the film forming gas supply section 30. Further, the inside of the vacuum vessel 2 is maintained at, e.g., process pressure of 0.1 Pa to apply bias voltage of 1500 W at 13.56 MHz onto the mounting portion 3 by the high frequency power supply section 34, and to set surface temperature of the mounting table 3 to 320° C.

High frequency (microwave) power of 2.45 GHz from the plasma generation high frequency power supply section 24 is guided (carried) through the wave-guide (tube) 25 to reach the ceiling portion of the vacuum vessel 2. The high frequency (microwave) power thus obtained is transmitted through the transmission window 23 so that microwave M is introduced into the plasma chamber 21. Magnetic field B produced by electromagnetic coils 27, 28 is applied to the a inside of the plasma chamber 21, e.g., at an intensity of 875 gauss from the upper direction toward the lower direction. As a result, E (electric field)×B (magnetic field) is induced by interaction between this magnetic field B and microwave M so that electron cyclotron resonance takes place. By this resonance, Ar gas is placed in plasma state and is caused to have high density. In this case, employment of Ar gas stabilizes plasma.

Plasma flow which has been caused to flow into the film forming chamber 22 from the plasma generating chamber 21 activates $C_4F_8$ gas and $C_2H_4$ gas delivered thereto to form active species. On the other hand, plasma ions, e.g., Ar ions in this example are drawn into the wafer 10 by bias voltage for drawing plasma. Thus, CF film is formed while shaving corner of CF film stacked on pattern (recessed portion) of the wafer 10 surface by sputter etching action of Ar ions to widen the frontage portion so that it is embedded into the recessed portion.

In this example, the inventors of this application have examined how n, m, k, s and film quality correspond to each other in the case where $C_nF_m$ gas and $C_kH_s$ gas are combined as film forming gas. In this case, n, m, k, s are integer. As an experiment, flow rates of $C_nF_m$ gas and $C_kH_s$ gas are set at 60 sccm and 30 sccm, respectively, and other process conditions are set as described in the above-described embodiment to form CF film having thickness of 1 μm to examine specific dielectric constant, adhesive property and hardness with respect to the CF film thus obtained.

Figure 2:
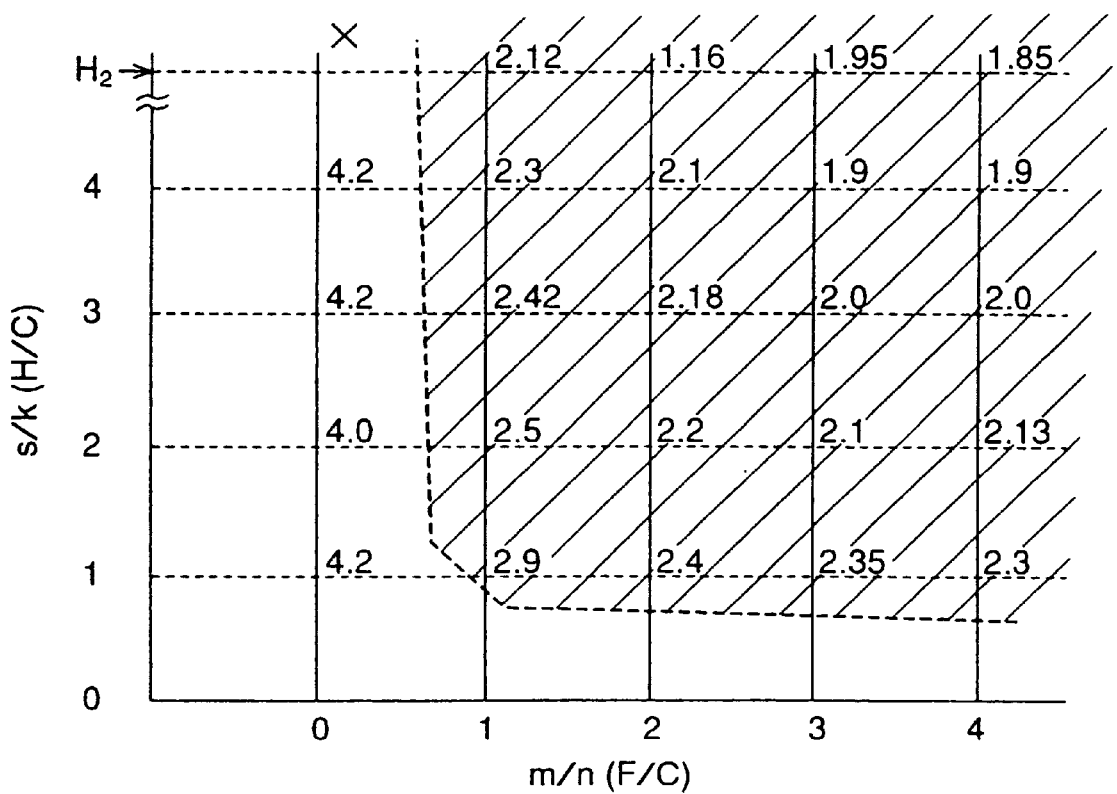
FIG. 2 is a characteristic diagram showing the relationship between kind of film forming gas and specific dielectric constant of CF film.
Figure 3:
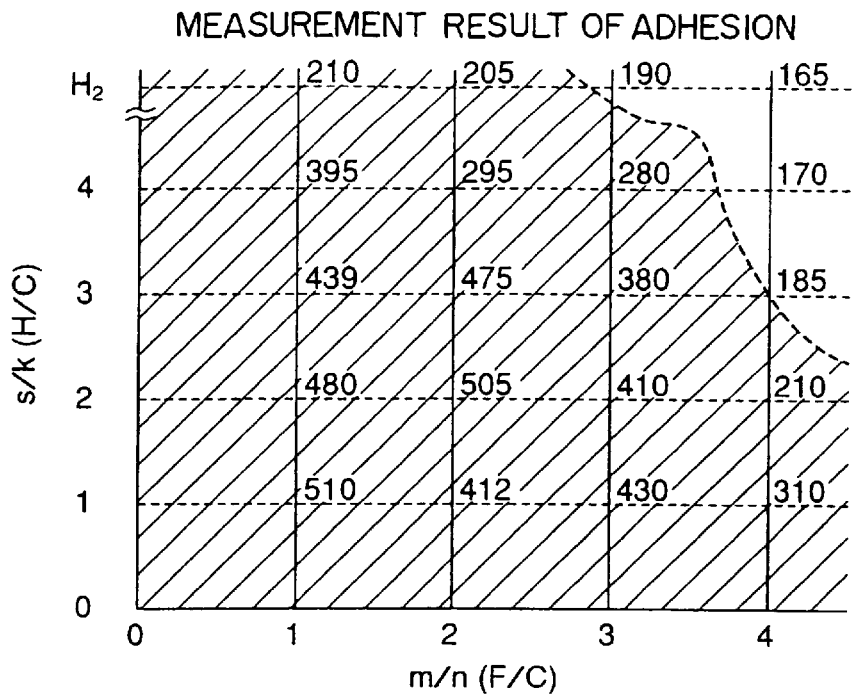
FIG. 3 is a characteristic diagram showing the relationship between kind of film forming gas and adhesive property of CF film.
Figure 4:
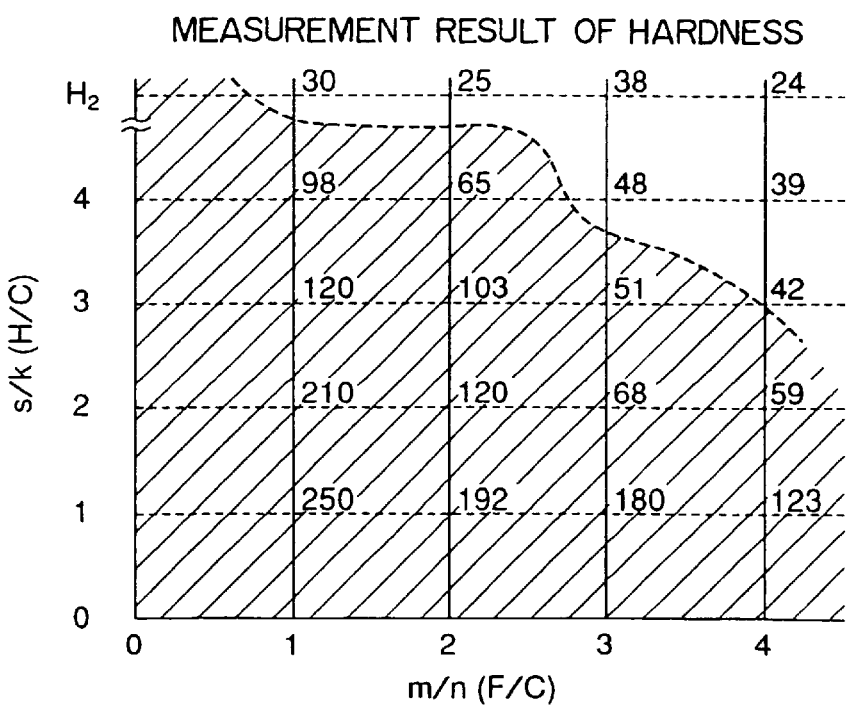
FIG. 4 is a characteristic diagram showing the relationship between kind of film forming gas and hardness of CF film.

As $C_nF_m$ gas, $CF_4$, $C_2F_6$, $C_3F_8$, $C_4F_8$, etc. may be used. In addition, as $C_kH_s$ gas, $H_2$, $CH_4$, $C_2H_2$, $C_2H_6$, $C_3H_8$, $C_4H_8$, etc. may be used. FIGS. 2 to 4 show results with respect to specific dielectric constant, adhesive property and hardness, respectively, wherein ratio between m and n of $C_nF_m$ gas is taken on the abscissa and ratio between s and k of $C_kH_s$ gas is taken on the ordinate. Numeric values described at cross points of respective values of the ordinate and the abscissa are data. For example, in the case of combination of $C_4F_8$ gas and $C_2H_4$ gas in FIG. 2, the specific dielectric constant is 2.2. In this case, data of the uppermost row is data in which $H_2$ gas is used as $C_kH_s$ gas.

With respect to measurement of the specific dielectric constant, CF film was formed on bare silicon surface to further form aluminum electrode thereon to connect electrode of specific dielectric constant meter between the silicon layer and the electrode to measure specific dielectric constant of CF film. With respect to measurement of adhesive property, CF film is formed on the bare silicon surface to fix, by adhesive agent, close contact test element on this CF film surface to draw up the test element to allow magnitude of drawing force ($kg/cm^2$) per test element unit area when CF film is peeled off from the bare silicon (Sebastian method). With respect to measurement of hardness, Shimazu dynamic very small hardness meter DUH-200 was used to carry out pushing test with respect to CF film under the condition of test weight 500 mgf, load speed 29 mgf/sec and test weight holding time 5 sec by triangular pyramid pressure element having ridge line interval of 115 degrees and pressure element front end curvature radius of 0.1 μm or less. When pushing depth is assumed to be D (μm), coefficient $(37.838) \times weight/D^2$ is determined as index of hardness (dynamic hardness).

In order to cope with high speed operation of the device, it is necessary that the specific dielectric constant is 3.0 or less and is preferably 2.5 or less. The range of combination of film forming gases to satisfy this range is shown by slanting lines in FIG. 2. With respect to adhesive property, in the case of the above-described test, if the drawing force is 200 $kg/cm^2$ or more, there is no possibility that peeling (separation) of film takes place when combined into the device. This range is indicated by slanting lines in FIG. 3. When hardness is too small, etch back process to mechanically ground, e.g., the surface to planarize it becomes difficult. For this reason, it is necessary that the above-mentioned range is 40 or more and is 50 or more. This range is shown by slanting lines in FIG. 4. When consideration is made with respect to such result, it is sufficient for lowering the specific dielectric constant to increase ratio of F in the film. However, if ratio of F is too high, adhesive property is bad and hardness is small. The reason thereof is as follows. It is considered that adhesive property and hardness contribute to C—C bond in the film. It is further considered that if ratio of F is high, the degree of C—C bonds becomes small.

Figure 5:
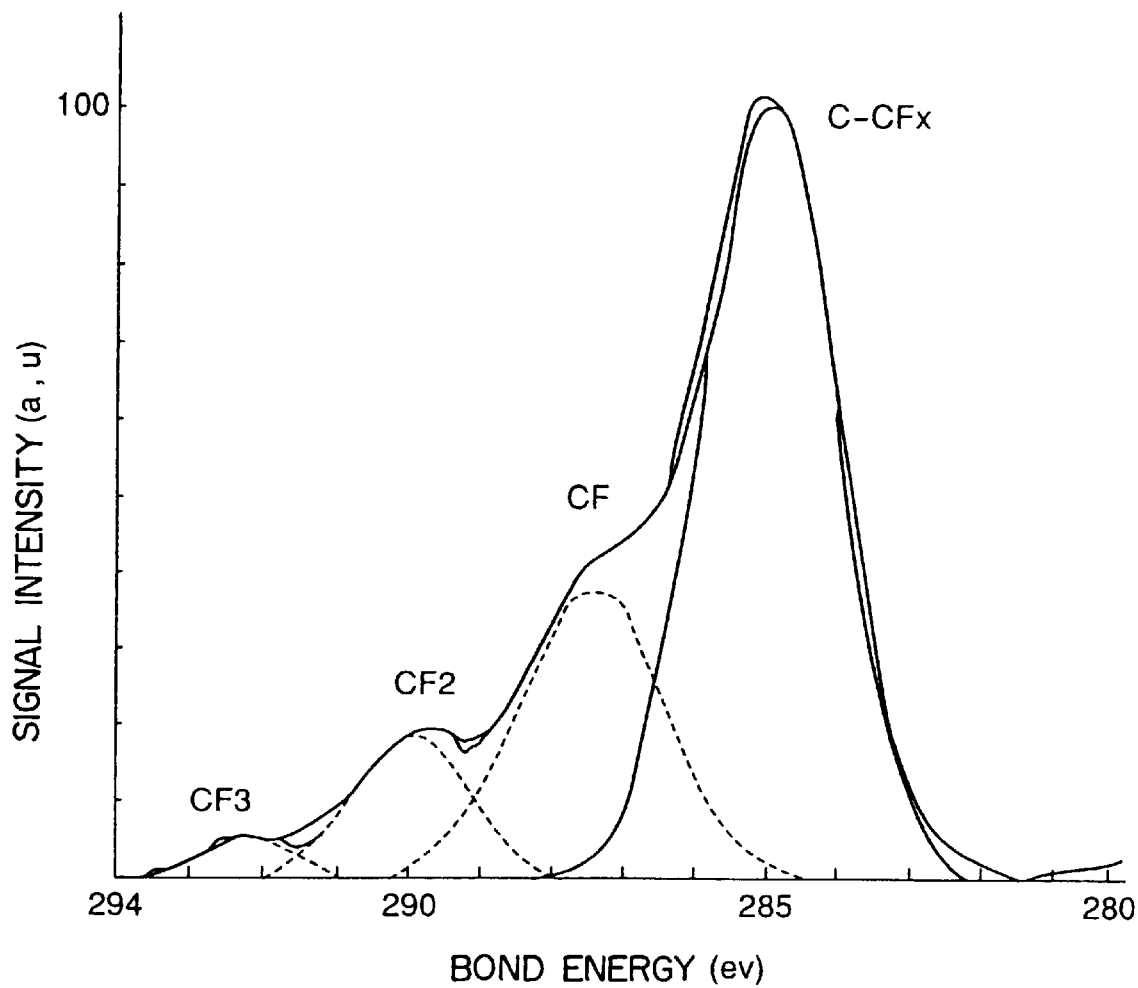
FIG. 5 is characteristic diagram showing result of X-ray photo-electron spectrum of CF film.

Accordingly, in order to ensure low specific dielectric constant, sufficient adhesive property and hardness, it is preferable that the slanting line regions of FIGS. 2 to 4 overlap with each other. In this case, with respect to hardness, in the case deviating from the slanting line region of FIG. 4, there is also a method of providing film having high hardness on the surface of the CF film to protect the surface. FIG. 5 shows result of X-ray photo-electron spectrum of CF film in the previously described process condition where mixed gas of $C_4F_8$ gas and $C_2H_4$ gas becomes film forming gas. From this result, it is seen that $CF_3$ group, $CF_2$, CF group and C—$CF_x$ group are included.

From facts as described above, the CF film formed by combination of $C_4F_8$ gas and $C_2H_2$ gas is such that the specific dielectric constant is 2.4, the adhesive property is 412 and the hardness is 192. It is seen that such CF film is preferable as the interlayer insulating film. It is to be noted that, in the above-described example, $H_2$ gas may be added in addition to $C_nF_m$ gas and $C_kH_s$ gas.

In another embodiment of this invention, double bonded or triple bonded gas, e.g., $C_2F_2$ gas or $C_2F_4$ gas is used as gas of CF system which is material gas. In this case, the CF film is advantageously excellent in the thermal stability. The thermal stability is the fact that extraction of F (fluorine) is made to small degree even if temperature becomes equal to high temperature. Namely, in order to electrically connect to each other respective wiring layers, e.g., aluminum wirings of the upper row side and the lower row side, interlayer insulating film is formed thereafter to form via hole, whereupon embedding of, e.g., W (tangusten) is carried out. In this case, the embedding process is carried out under temperature of, e.g., about 450° C. Moreover, there are instances where aluminum is caused to flow into via hole. In this case, this reflow process is carried out at about 400° C. or more. F is extracted when the interlayer insulating film is heated so that temperature higher than film forming temperature is provided. Extraction of F is made to less degree as compared to gas of the primary bond if there is used gas in which C and F are double bond or triple bond as material gas. When extraction of F is made to more degree, the specific dielectric constant is increased. Film peeling (separation) by contraction of the CF film itself takes place. Further, because extraction is made as gas, peeling (separation) at the surface between the CF film and the W film is apt to take place. In addition, there is the possibility that aluminum may be corroded under the existence of Cl and F used at the time of etching of aluminum wiring. Accordingly, it is desirable that the thermal stability is large.

EXPERIMENTAL EXAMPLE

The plasma film forming apparatus shown in FIG. 1 was used to deliver $C_4H_8$ gas, $C_2F_4$ ($CF_2$=$CF_2$) gas and $C_2H_4$ gas as material gas at flow rates of 70 sccm, 30 sccm and 15 sccm, respectively, into the film forming chamber 22 to form CF film having film thickness of 1 μm in the state where other process conditions are similar to the above-mentioned embodiment. This embodiment is assumed to be taken as the embodiment 1. Moreover, CF film was formed similarly to the embodiment 11 except that $C_4F_8$ gas and $C_2H_4$ gas are delivered at flow rates of 70 sccm and 40 sccm, respectively. This embodiment is taken as the comparative example 11.

Figure 6:
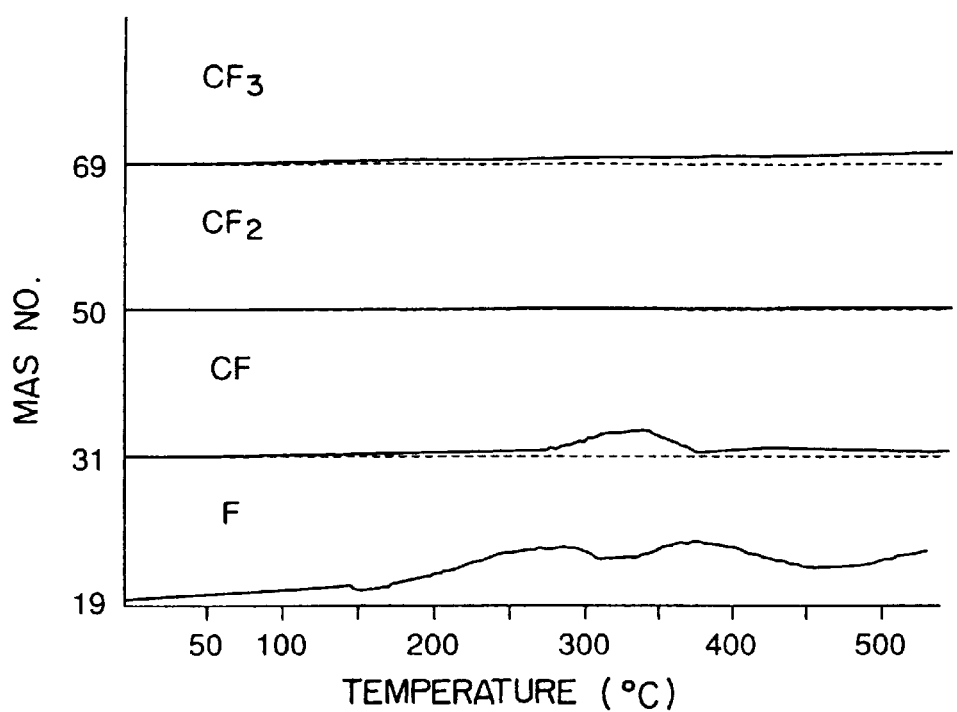
FIG. 6 is a characteristic diagram showing result of mass analysis of gas generated when temperature is changed with respect to CF film.
Figure 6:
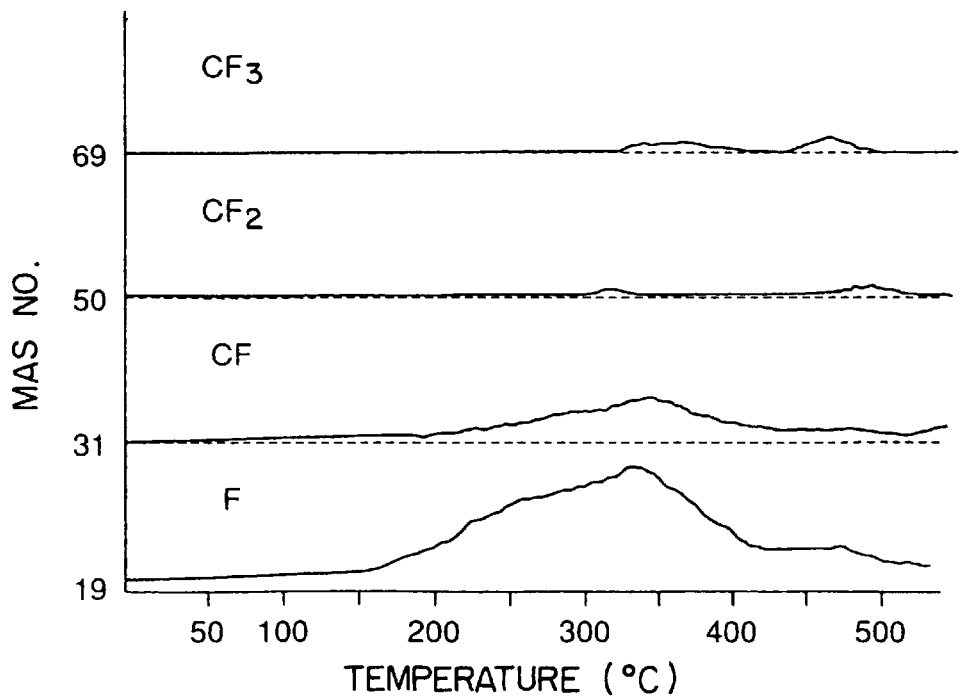

With respect to these CF films, when discharge quantities of F, CF, $CF_2$, $CF_3$ at respective temperatures are measured by the mass analyzer, results shown in FIGS. 6(a), 6(b) were obtained. In addition, the specific dielectric constant and the film forming speed were the following results.

| | SPECIFIC DIELECTRIC CONSTANT | FILM FORMING SPEED (angstrom/min) |
|---|---|---|
| Embodiment 11 | 2.0 | 2650 |
| Comparative Example 11 | 2.75 | 2300 |

As seen from this result, in the case where the conditions except for material gas are the same, it is seen that, in the case of the embodiment 11, discharge quantities of F, CF, $CF_2$, $CF_3$ are smaller and thermal stability is large. The reason why extraction of F is small is as follows. It is estimated that C—C bonds are formed in a three-dimensional network form, i.e., network structure of C—C is formed and F is difficult to be extracted even if C—F bond is dissociated. Further, in the case where double bonded or triple bonded C—F system gas is used, it is considered that the number of C—C bonds having C—F bond is increased to more degree because of reaction mechanism in which dissociation of F of C—F bond is not required where network structure is formed by polymerization reaction of the material gas itself.

On the other hand, while, in material gas of the comparative example, ratio of $C_2H_4$ gas is increased so that the number of C—C bonds is increased to more degree, ratio of F is lowered in this case so that the specific dielectric constant is increased.

Furthermore, in this invention, as gas of CF system which is material gas, molecular structure in which four CF groups are bonded to one C, e.g., $C(CF_3)_4$ or $C(C_2F_5)_4$, etc. may be used alone or may be used in a manner mixed with $C_4F_8$ gas or $C_2F_2$ gas, etc. previously described. When such an approach is employed, C—C network structure is apt to be formed. Thus, thermal stability is large.

The reason thereof is as follows. In the case of $C(CF_3)_4$ as shown in FIG. 7(a), it is considered that C—F bond is cut and C or F is bonded thereto. However, when C is bonded, because this C has four C—C bonds encompassed by dotted lines, the number of C—C bonds is increased. In addition, since there results a form such that chain of C—C bonds is spread in four directions with respect to respective C, strong network structure by C—C bonds is formed. In addition, since the number of F is 12 whereas the number of C—C bonds is 4, the number of F is large as a whole, thus making it possible to ensure low specific dielectric constant.

On the contrary, in the case of the ring-shaped structure like $C_4F_8$, it is possible to take strong network structure to some degree as shown in FIG. 7(b). However, since the number of F is small value which is eight with respect to the fact that the number of C—C bonds is 4, the specific dielectric constant becomes higher. Moreover, in the case of simple primary bond like $C_4F_{10}$ as shown in FIG. 7(C), C is not necessarily bonded when C—F bond is cut, but F is also bonded. For this reason, C—C bonds are difficult to be resultantly spread in a chained manner in three-dimensional direction. Thus, it is considered that considerably strong network structure cannot be taken.

EXPERIMENTAL EXAMPLE

In this example, the plasma film forming apparatus shown in FIG. 1 was used to deliver $C_4F_8$ gas, $(CF_3)_4C$ gas and $C_2H_2$ gas at flow rates of 60 sccm, 40 sccm and 20 sccm, respectively, and to form CF film having film thickness of 1 μm in the state where pressure is set at 0.18 Pa and other process conditions are set as the same as those of the previously described embodiment 11. This experimental example is taken as the comparative example 21.

Moreover, CF film is similarly formed except that $C_4F_8$ gas and $C_2H_4$ gas are delivered at flow rates of 100 sccm and 20 sccm, respectively. This embodiment is taken as the comparative example 21.

Figure 8:
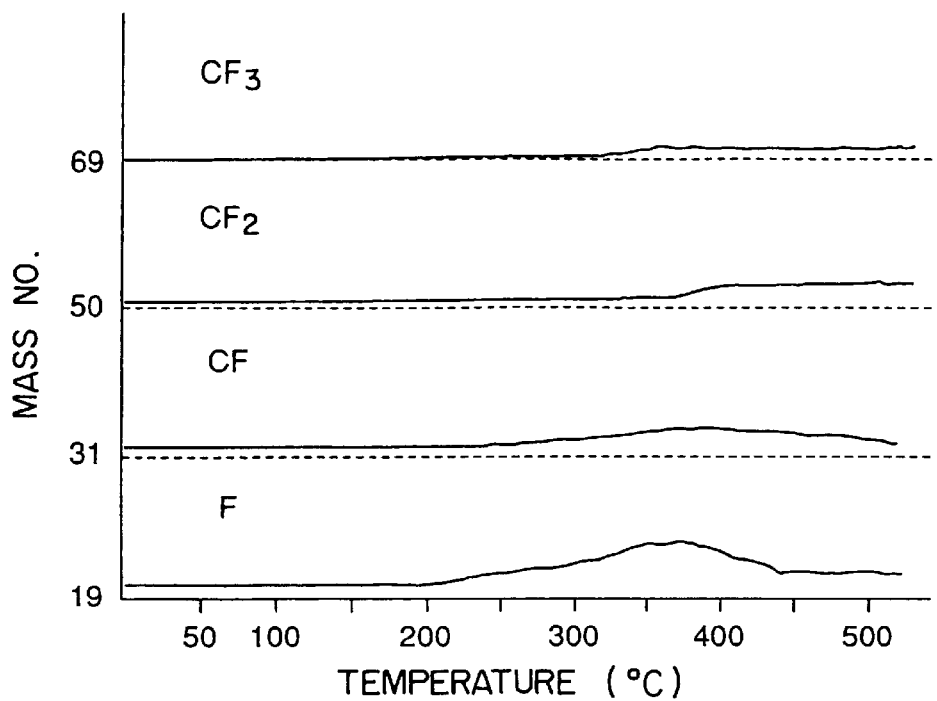
FIG. 8 is a characteristic diagram showing result of mass analysis of gas generated when temperature is changed with respect to CF film.
Figure 8:
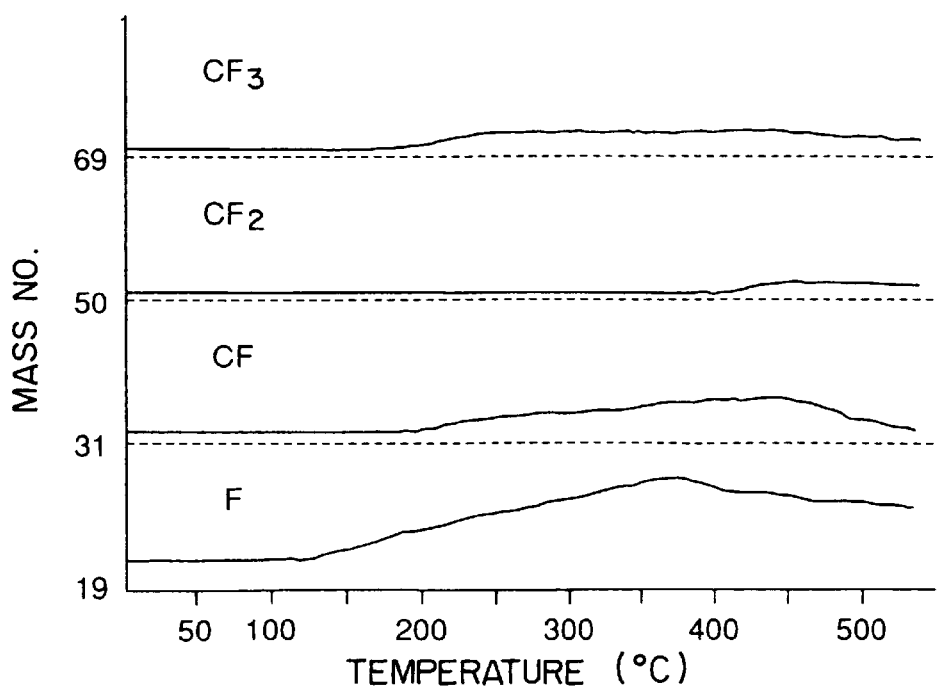

As the result of the fact that measurement is carried out by the mass spectrometer similarly to the previously described embodiment 11, etc. with respect to the CF film of the embodiment 21 and the comparative example 21, results shown in FIGS. 8(a), (b) were obtained. Moreover, as the result of the fact that the specific dielectric constant is examined with respect to the embodiment 21 and the comparative example 21, the specific dielectric constants were 2.1 and 2.7, respectively. As seen from this result, the embodiment 21 has lower specific dielectric constant and greater thermal stability as compared to the comparative example 21.

Figure 9:
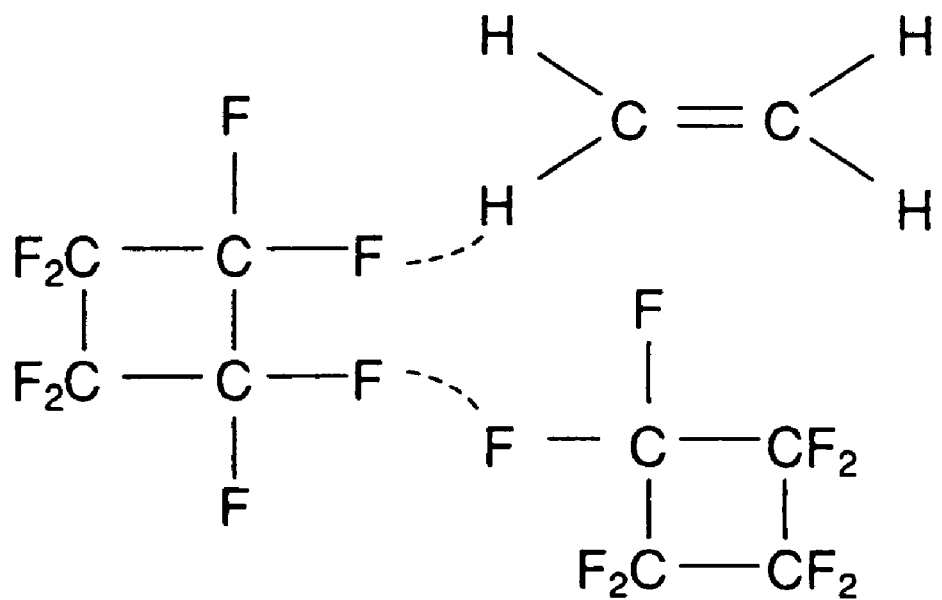
FIG. 9 is an explanatory view showing the state of reaction of film forming gas.

Further, in this invention, as preferable material gas, gas of CHF system can be mentioned. As CHF system gas, $CH_3(CH_2)_3$ $CH_2F$, $CH_3(CH_2)_4CH_2F$, $CH_3(CH_2)_7CH_2F$, $CHCH_3F_2$, $CHF_3$, $CH_3F$ and $CH_2F_2$, etc. are mentioned. In this case, there are merits as described below. Initially, such material gas has higher film forming speed as compared to mixed gas of CF system gas and CH system gas. For example, in mixed gas of $C_4F_8$ and $C_2H_4$ gas, it is considered that, as shown in FIG. 9, F of $C_4F_8$ and H of $C_2H_4$ are bonded and material gas thus obtained are given off as HF, so C—C bond is formed or F of one $C_4F_8$ and F of other $C_4F_8$ are bonded and material gas thus obtained are given off as $F_2$, so C—C bond is formed.

Figure 7:
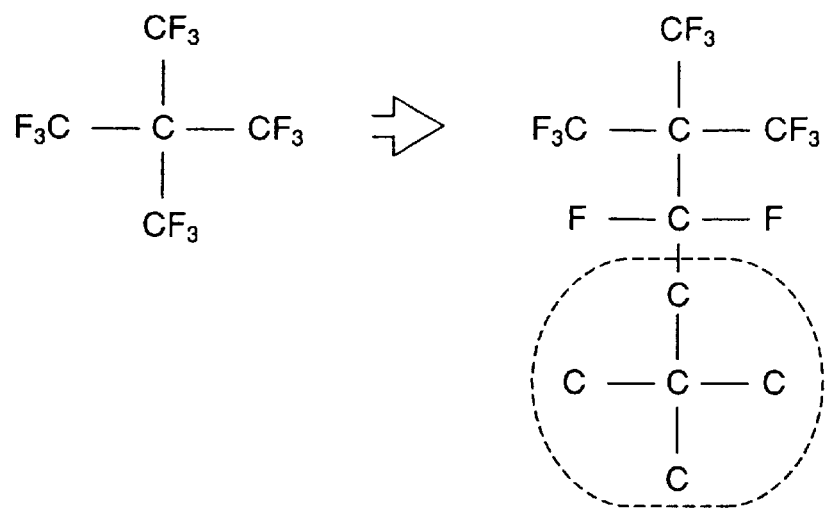
FIG. 7 is an explanatory view showing molecular structure of film forming gas.
Figure 7:
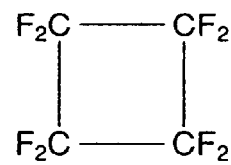
Figure 7:
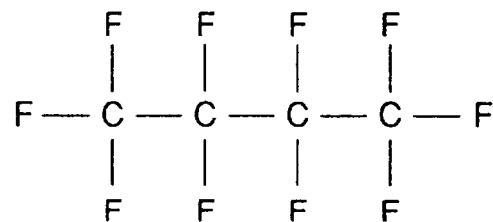

As compared to the case where F—F bond is formed, H—F bond can be formed by smaller energy. However, the probability that molecule of $C_2H_4$ exists at a portion adjacent to molecule of $C_4F_8$ is the probability corresponding to flow rate ratio, etc. in practice. When simply considered, the probability is 50%. On the contrary, if gas of CHF system is employed, since all molecules include F and H as shown in FIG. 7, F of one molecule and H of the other molecule are apt to be bonded so that C—C bonds are apt to be formed. This means that if energy given to gas is the same, the film forming speed is high. In the case where gas of CHF system is used, in order to allow the specific dielectric constant to be as small as possible, it is preferable to use gas having a larger number of F as compared to the number of C, e.g., $CHF_3$ gas, etc. In addition, gas of CF system may be added in addition to gas of CHF system and gas of CH system.

EXPERIMENTAL EXAMPLE

Figure 10:
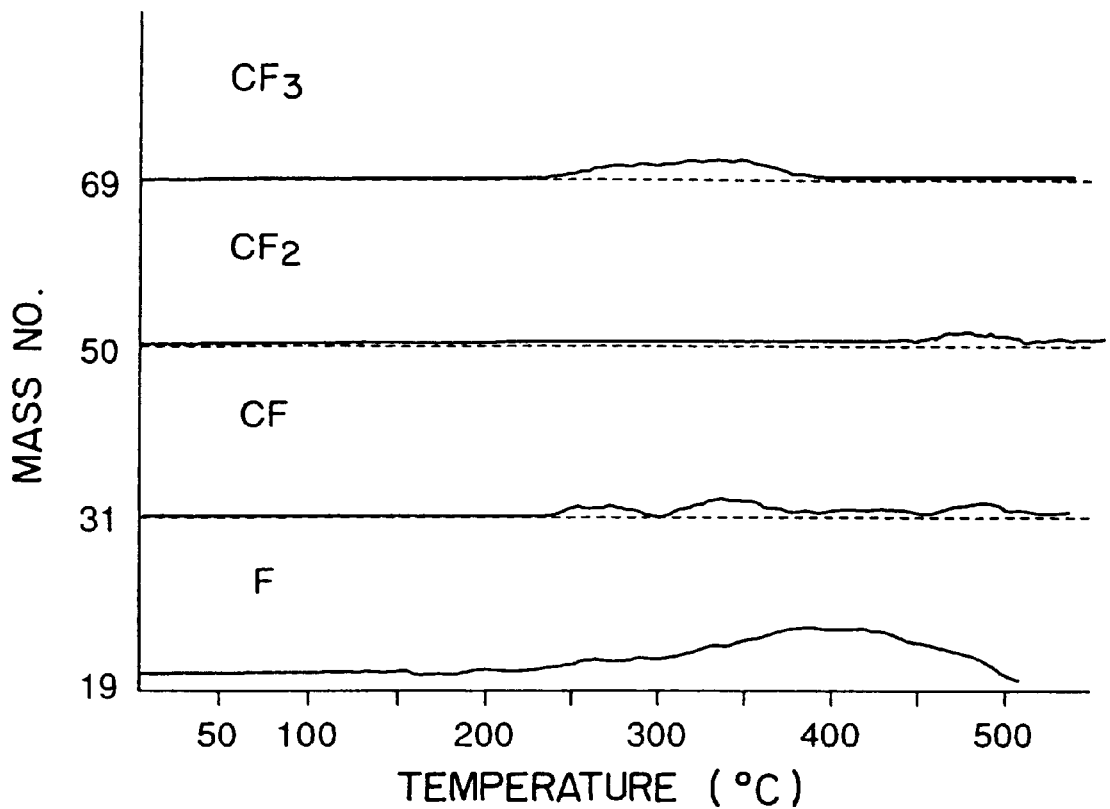
FIG. 10 is a characteristic diagram showing result of mass analysis of gas generated when temperature is changed with respect to CF film.

In this case, the plasma film forming apparatus shown in FIG. 1 was used to deliver $CHF_3$ gas and $C_2H_4$ gas at flow rates of 60 sccm and 30 sccm, respectively, to form CF film having film thickness of 2.0 μm in the state where other process conditions are similar to those of the previously described embodiment 11. This embodiment is taken as the embodiment 31. As the result of the fact that measurement is carried out by the mass spectrometer similarly to the previously described embodiment 11, etc. with respect to this embodiment 31, result shown in FIG. 10 was obtained. As seen from comparison between the result of FIG. 10 and the previously described comparative example 11 shown in FIG. 6(b), the method using gas of CHF system is excellent in the thermal stability. Further, measurement results of the film forming speed and the previously described dynamic hardness in the embodiment 31 and the comparative example 21 are indicated below. In this case, hardness in the case where high frequency bias is applied to the wafer is also described for reference.

|  | Film forming speed (Angstrom/min) | hardness |
| --- | --- | --- |
| Embodiment 31 | 4300 | 200.6 |
| Embodiment 31 (no bias) | 6800 | 80.8 |
| Comparative Example 11 | 2300 | 106.6 |
| Comparative Example 11 (no bias) | 3100 | 56.5 |

As seen from this result, if gas of CHF system is used, the film forming speed is high and the through-put is improved. In addition, CF film having large hardness is obtained.

Figure 11:
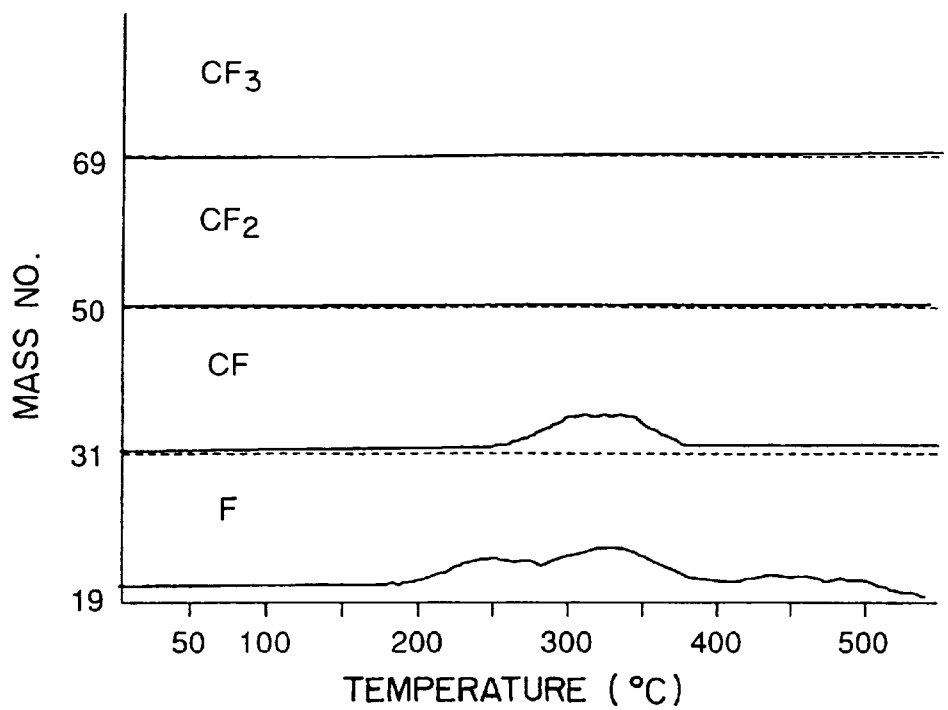
FIG. 11 is a characteristic diagram showing result of mass analysis of gas generated when temperature is changed with respect to CF film.
Figure 11:
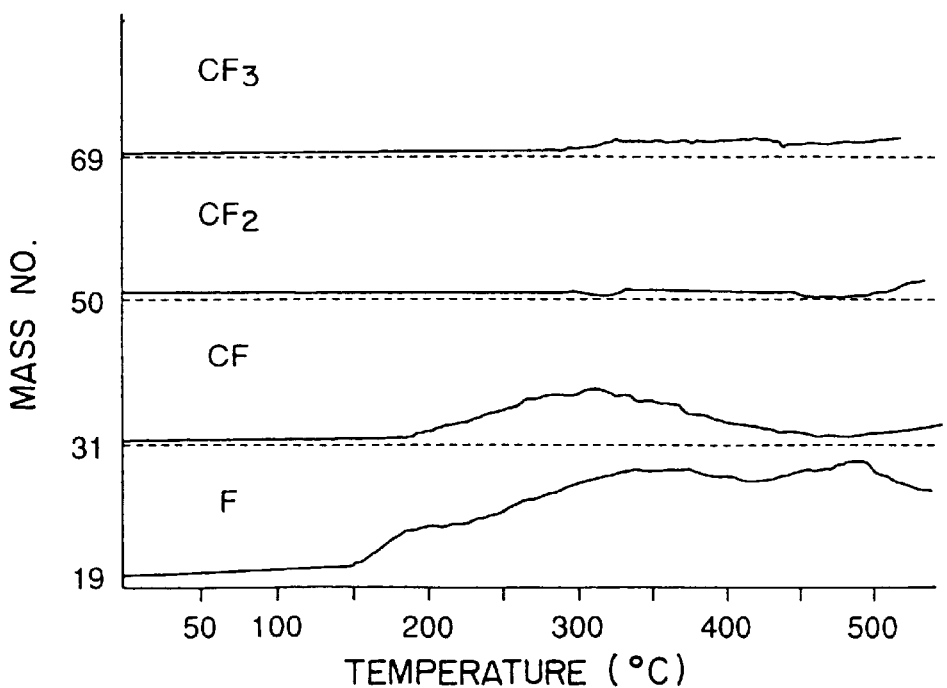

In order to examine the relationship between the film quality of the CF film and the mounting table surface temperature of the wafer in the above-mentioned embodiment, as the result of the fact that mounting table surface temperatures are set to 350° C. and 220° C., respectively, in the process condition (the condition used in the description of $C_nF_m$ gas+$C_kH_s$ gas) of the previously described embodiment to carry out the previously described mass analysis with respect to the formed CF film, results shown in FIGS. 11(a), (b) were obtained. The reason is as follows. It is considered that according as the thermal energy at the wafer surface becomes larger, temperature becomes higher, and the energy of the active species thus becomes large so that the number of C—C bonds is increased to higher degree and dissociation of F is developed. In addition, since about 450° C. is limit even if the semiconductor device in which wiring is formed is caused to have high temperature, combination of $C_4F_8$ gas and $C_2H_4$ gas is effective combination since the thermal stability is large at the process temperature of about 350° C.

Figure 12:
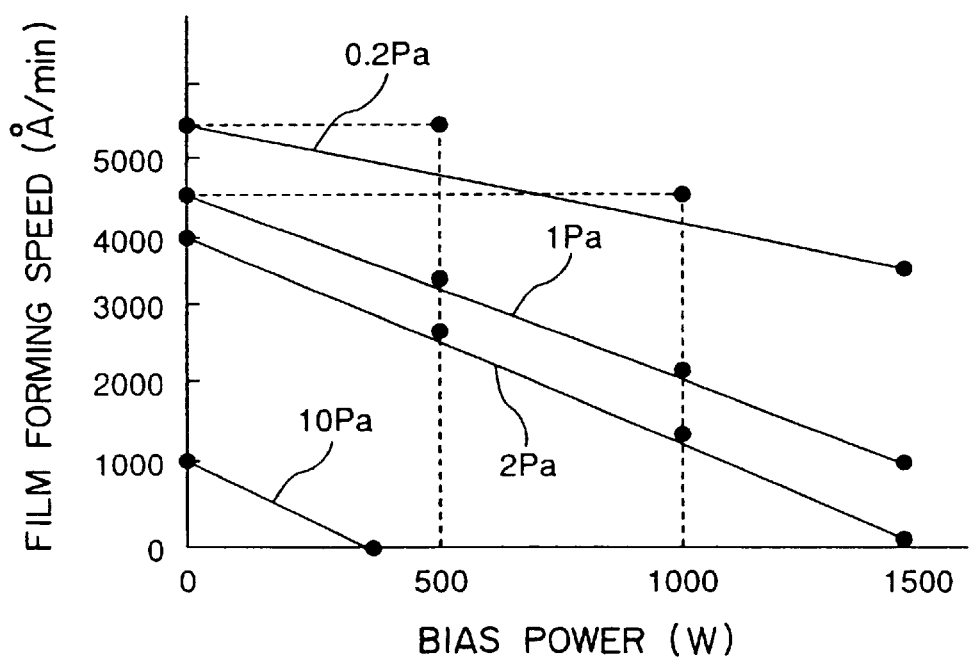
FIG. 12 is a characteristic diagram showing the relationship between bias powers every process pressures and film forming speeds.

As the result of the fact that the apparatus of FIG. 1 is used to examine the relationship of pressure within the vacuum vessel 2, film quality of the CF film, adhesive property and the film forming speed, results of FIGS. 12 and 13 were obtained. FIG. 12 is the result that the relationship between bias power applied to the mounting table 3 and the film forming speed is determined every pressure. With respect to the process condition, power of microwave is set at 2.7 kw and flow rates of $C_4F_8$ gas, $C_2H_4$ gas and Ar gas are set at 60 sccm, 30 sccm and 150 sccm, respectively, and the surface temperature of the mounting table is set at 200° C. Other conditions such as magnetic field, etc. are similar to the conditions described in the previously described embodiment.

As seen from the result of FIG. 12, according as pressure becomes higher, and bias power becomes larger, the film forming speed becomes lower. This is because it is considered that when pressure becomes high, mean free path of ions becomes short and collision energy between ions and molecules becomes small, so the speed at which the active species are taken into the film becomes low. In addition, when bias power becomes large, the etching effect by ions becomes large, and the film forming speed becomes low.

The inventors of this application have examined from a viewpoint of film stress (stress) that adhesive property between CF film and its underground film, silicon substrate in this example on the basis of estimation that when pressure becomes lower, the mean free path is elongated, and the speed in which active species are taken into the film becomes high so that fine film is formed.

FIG. 13 is result in the case where bias power is set at 0 W among process conditions when data of FIG. 12 is taken to examine magnitude of stress with respect to the CF film obtained on the silicon substrate and presence/absence of film peeling (separation). In this case, the case where pressures are set to 1.2 Pa, and 1.5 Pa, respectively, to carry out process is also demonstrated in combination. Calculation of stress was carried out by the following formula.

$$S=E(D)^2/6(1-V)RT$$

In the above-mentioned formula, S is stress, E is Young's modulus of silicon substrate, V is Poisson ratio of the silicon substrate, D is thickness of the silicon substrate, R is curvature radius of the entirety of wafer and T is film thickness of CF film (T is assumed to be sufficiently smaller than D).

Figure 14:
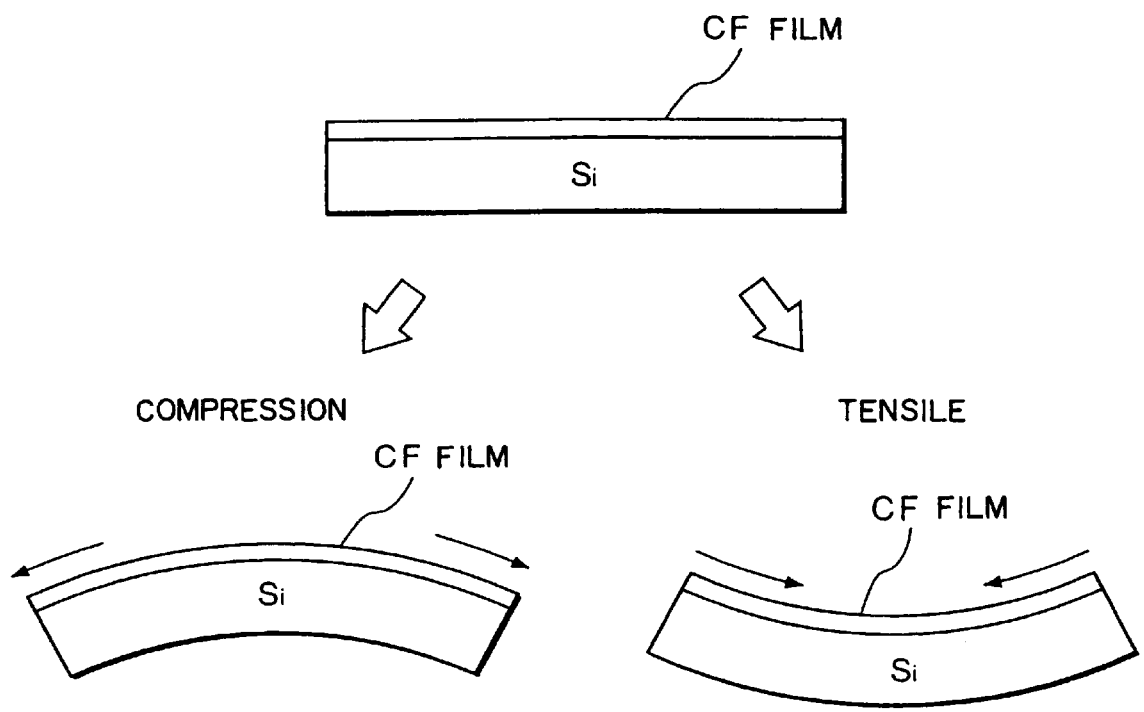
FIG. 14 is an explanatory view showing the state of stress of CF film.

Compression/tensile in stress is distinction indicating how force the silicon substrate applies when viewed from the CF film, and the reason why such stress is applied is that difference takes place in contraction by material when temperature of the wafer returns to room temperature. Further, in the case where the CF film attempts to be fine as shown in FIG. 14, C are slid into the film in order from after. Accordingly, the CF film itself attempts to be widened, and its expansion of the silicon substrate attempts to suppress its expansion. Thus, the CF film applies compression from the silicon substrate.

On the contrary, since the CF film itself attempts to be contracted in the case where fineness of the CF film is poor, the CF film is pulled from the silicon substrate. However, when tensile stress is applied, the film is apt to be separated or peeled. A method of examining presence/absence of film separation is carried out by sticking adhesive tape on the surface of the CF film to observe whether or not the CF film is separated or peeled from the silicon substrate when this tape is peeled or separated.

It is to be noted that while $SiO_2$ film is also the same tendency, since difference of coefficient of thermal expansion with respect to silicon is large in the case of $SiO_2$, large compressive stress is applied before influence of fine property of the film. Accordingly, adhesive property therebetween is high.

From the result of FIG. 13, it is preferable that pressure is set at 1 Pa or less in order to prevent film separation. Moreover, in order to ensure the etching characteristic of the shoulder portion of the recessed portion by ions at the time of embedding to carry out satisfactory embedding, it is considered that bias power is required to be at least about 500 W. However, when attempt is made to ensure the film forming speed so that it is equal to 4000 angstroms/min or more, it is preferable that pressure is 1 Pa or less from the graph of FIG. 12. The magnitude of this film forming speed is determined by back calculation in the case where attempt is made to process 10~11 films per one hour also in consideration of the cleaning process when CF film of 1 μm is formed.

Moreover, as the result of the fact that bias power is set at 1500 W under the process condition when data of FIG. 12 is taken and embeddable aspect ratios (depth/width of recessed portion) are examined at 0.2 Pa and 1 Pa, respectively, they were 2 and 0.8, respectively. Accordingly, it can be said that the case where pressure is low exhibits good embedding characteristic. Further, since collision energy between molecules and ions is large in the case where pressure is low, the energy of the active species becomes large. As a result, it is estimated that the number of C—C bonds is increased and F in the film is knocked on to increase the number of C—C bonds so that the thermal stability is large.

Then, in order to examine the relationship between magnitude of microwave power and adhesive property of CF film, the microwave power is set to 1000 W, 1500 W, 2000 W, 2500 W, 2700 W, 3000 W and 3500 W and CF film having thickness of 10000 angstroms is formed on 8 inch wafer and adhesive property is measured by the previously described Sebastian method. Thus, result shown in FIG. 15 was obtained. The process conditions except for the microwave power are set as similar condition to deliver $C_4F_8$ gas, $C_2H_4$ gas and Ar gas at flow rates of 60 sccm, 30 sccm and 150 sccm, respectively, to set pressure to 0.2 Pa to set mounting table surface temperature to 320° C. and to set bias power of the mounting table 3 to 1500 W. Other conditions are the same in the case of the previously described embodiment.

Figure 15:
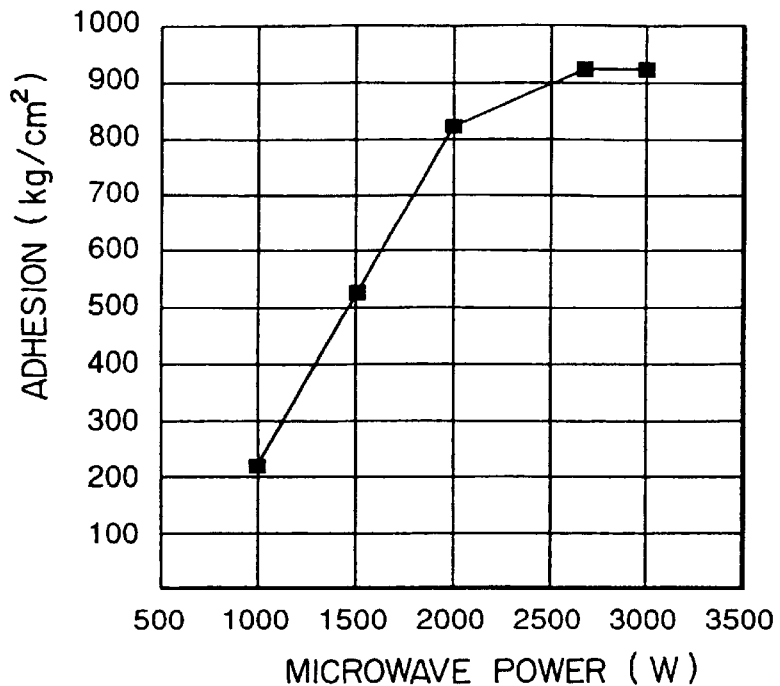
FIG. 15 is an explanatory view showing dependency of microwave power with respect to adhesive property of CF film.
Figure 16:
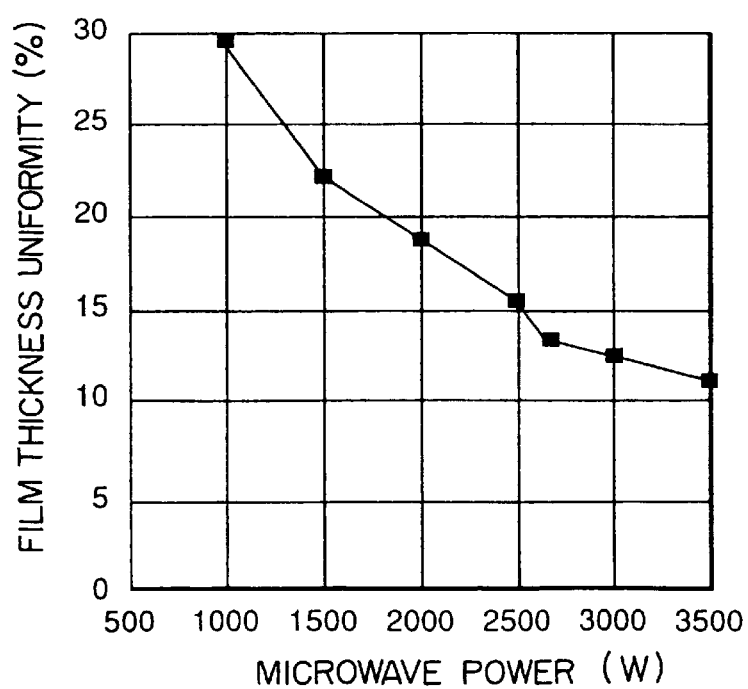
FIG. 16 is an explanatory view showing dependency of microwave power with respect to film thickness uniformity of CF film.

As seen from the result of FIG. 15, according as the microwave power become larger, adhesive property of the CF film is improved. When viewed from practical use for assembling such film into the device as previously described, it is preferable that the adhesive property indicates 200 kg/cm² or more. For this reason, when viewed only from the adhesive property, it is necessary that the microwave power is 1000 W or more. On one hand, as the result of the fact that uniformity of film thickness within plane of the CF film thus obtained is examined every respective microwave powers, result shown in FIG. 16 is obtained. Since it is preferable that the film thickness uniformity is 20% or less from a viewpoint of practical use, it is desirable that the microwave power is 2000 W or more when combined with data of adhesive property. Since the volume within the vacuum vessel 2 is 0.2 m³ in this example, the microwave power required per unit volume of the vacuum vessel 2 is 10000 W/m³ or more. As the result of the fact that examination is made also with respect to hardness of the CF film formed under the condition where the microwave power is 2000 W or more, sufficient hardness was obtained. It is estimated that the reason why adhesive property is improved when the microwave power is set at large is that energy of active species of film forming gas is large and the number of C—C bonds is increased. In addition, it is considered that the reason why the film thickness uniformity is improved is that uniformity of plasma density is improved.

Figure 17:
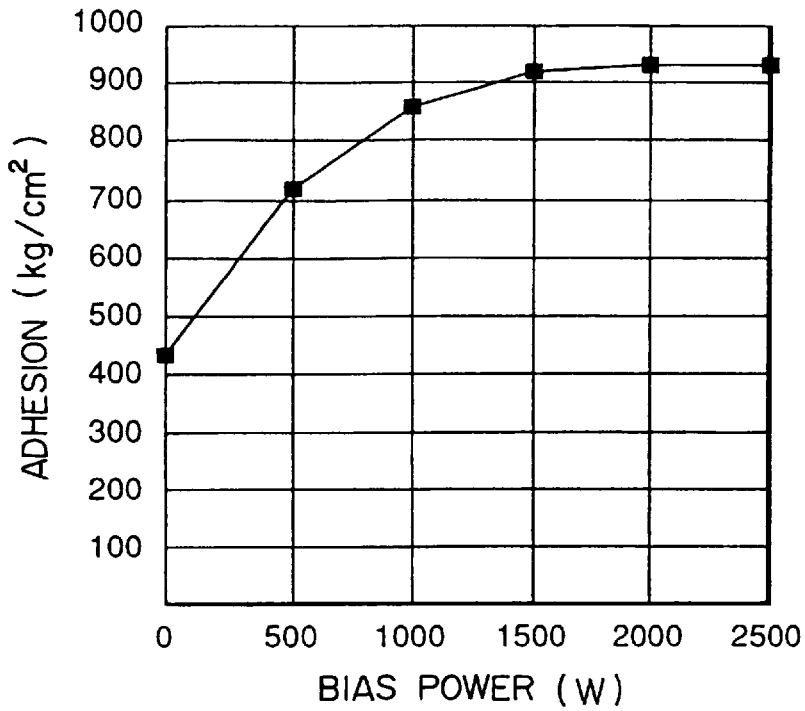
FIG. 17 is an explanatory view showing dependency of bias power with respect to adhesive property of CF film.
Figure 18:
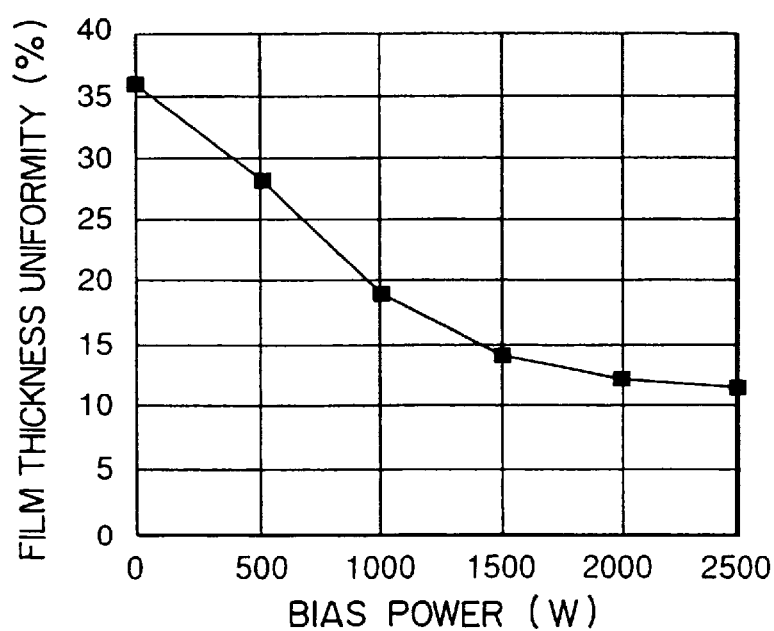
FIG. 18 is an explanatory view showing dependency of bias power with respect to film thickness uniformity of CF film.

Furthermore, as the result of the fact that the microwave power is set to 2700 W and bias power of the mounting table is changed to examine dependency of bias power with respect to the adhesive property and uniformity of the in-plane film thickness of the CF film, results shown in FIGS. 17 and 18 were obtained. Other process conditions are the same condition when data is measured shown in FIG. 15 is measured. From this result, it is preferable that the magnitude of bias power is 1000 W or more. In this example, since the area of the upper surface of the mounting table 3 is $3.14 \times 10^{-2}$ m² in this example, preferable power per unit area is 3.14 W/m² or more. It is to be noted that the specific dielectric constant of the CF film in such condition is sufficiently low value of 3.0 or less.

FIG. 19 is a graph obtained by examining dependency of bias power with respect to the embedding characteristic. The process condition is the same when data of FIGS. 17 and 18 are taken. In FIG. 19, mark indicates that satisfactory embedding is made, and mark x indicates that voids take place. The width between aluminum wirings used for embedding is 0.4 μm. It is seen from this result that when bias power is set larger, the embedding characteristic can be improved. The reason thereof is as follows. It is considered that sputtering etching effect of the shoulder portion of the recessed portion by ions is enhanced.

Another embodiment of this invention will now be described. This embodiment contemplates adding $O_2$ gas to material gas to thereby improve the embedding characteristic. In general, in the case where insulating film is buried (embedded) between wirings, the portions of both shoulders of the recessed portion are swollen in the middle of embedding so that the frontage portion is closed. For this reason, bias power is applied to the mounting table to vertically draw Ar ions onto the wafer to carry out film forming while shaving the frontage portion. However, when aspect ratio exceeds 4, the effect of Ar sputter is not so exhibited. As a result, voids (gaps) are apt to be formed.

In view of the above, the inventor has proposed to pay attention to the fact that CF film chemically reacts with $O_2$, and is removed as $CO_2$ (chemically etched) to deliver $O_2$ gas in addition to film forming gas, e.g., $C_4F_8$ gas and $C_2H_4$ gas from film forming gas supply unit 30 shown in FIG. 1 to thereby improve embedding of high aspect ratio.

Figure 20:
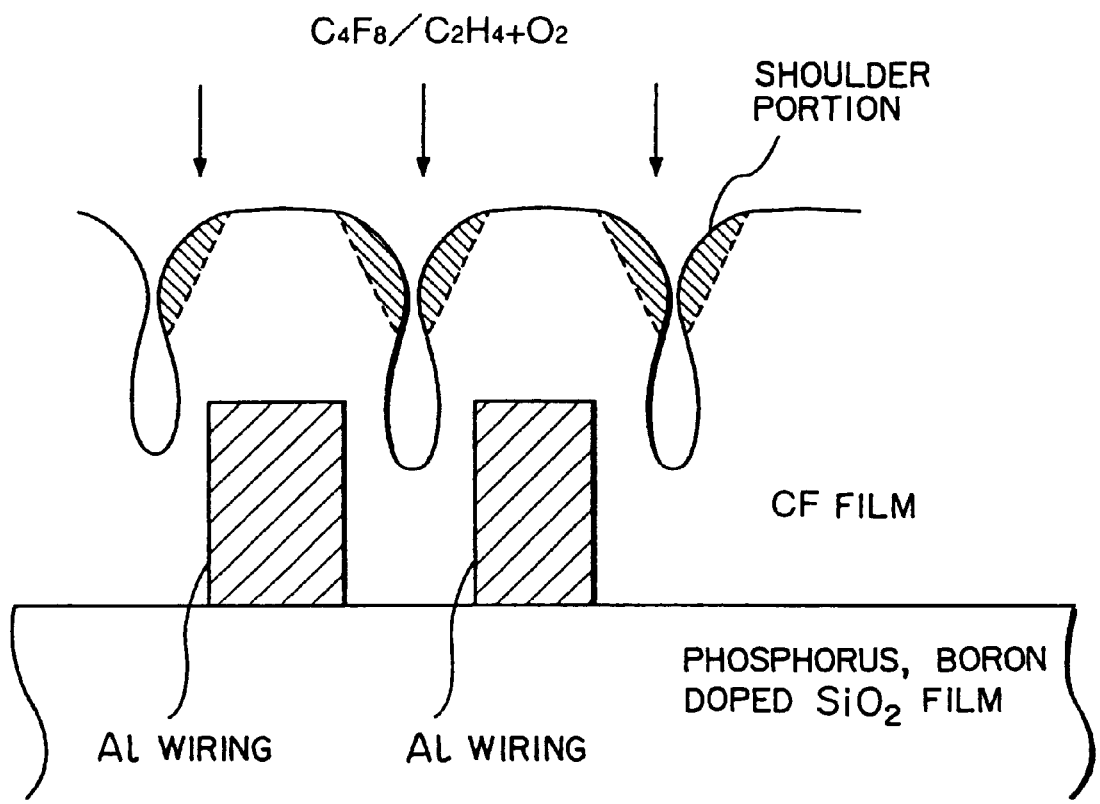
FIG. 20 is an explanatory view showing the embedded state between wirings by CF film.

FIG. 20 is a view showing the state where embedding between aluminum wirings in the case where $O_2$ gas is continuously added is carried out. It is considered that $O_2$ gas is activated to react with C of CF film so that $CO_2$ is provided to chemically etch the CF film. Accordingly, this etching and film forming proceed at the same time. It is considered that this chemical etching is greater than action of Ar sputter as seen from the experimental example of the embedding characteristic which will be described later, i.e., etching speed by $O_2$ is greater than etching speed by Ar ions with respect to the CF film. In this case, in this invention, the sputter etching effect may be used in combination with the conventional sputter etching effect by Ar ions.

In the case where Ar gas is used as plasma gas, $O_2$ gas delivered from film forming gas supply section is further activated by the electron cyclotron resonance by energy of plasma so that ions are provided. For this reason, $O_2$ gas collides with wafer by bias power of the mounting table with high perpendicularity. As a result, since particularly etching speed of the shoulder portion (portion of the frontage) is large as shown in FIG. 20, embedding is carried out while sufficiently broadening the frontage portion. For this reason, it is possible to carry out embedding also with respect to the recessed portion of high aspect ratio. On the contrary, since etching speed is small in the case of sputter etching of only Ar ions, in the case where the recessed portion having large aspect ratio is buried, etching of the frontage portion does not overtake with respect to embedding, so voids are apt to be formed.

In order to confirm effect of $O_2$ gas, the apparatus shown in FIG. 1 was used to carry out embedding test of the recessed portion in which the portion between aluminum wirings is 0.2 μm in the case where $C_4F_8$ gas, $C_2H_4$ gas and $O_2$ gas are delivered at flow rates of 60 sccm, 30 sccm and 20 sccm, respectively, from the film forming gas supply unit and in the case where no $O_2$ gas is added. As a result, in the case where no $O_2$ gas is added, when the aspect ratio exceeds 4, occurrence of voids can be observed. However, in the case where $O_2$ gas is added, even if the aspect ratio is 5, no occurrence of void takes place. Thus, satisfactory embedding could be carried out.

In this experiment, the microwave power is set to 2700 W, the bias power of the mounting table is set to 1500 W, the pressure is set to 0.2 Pa, and the surface temperature of the mounting table is set to 350° C., and other conditions are similar to the conditions of the previously described embodiment.

Moreover, as described above, as a technique for carrying out embedding by making use of chemical etching by $O_2$ gas, film forming by $C_4F_8$ gas and $C_2H_4$ gas serving as film forming gas may be first carried out without delivering $O_2$ gas to carry out etching after undergone switching from supply of film forming gas to supply Of $O_2$ gas in the middle thereafter to carry out switching from supply of $O_2$ gas to supply of film forming gas for a second time.

Figure 21:
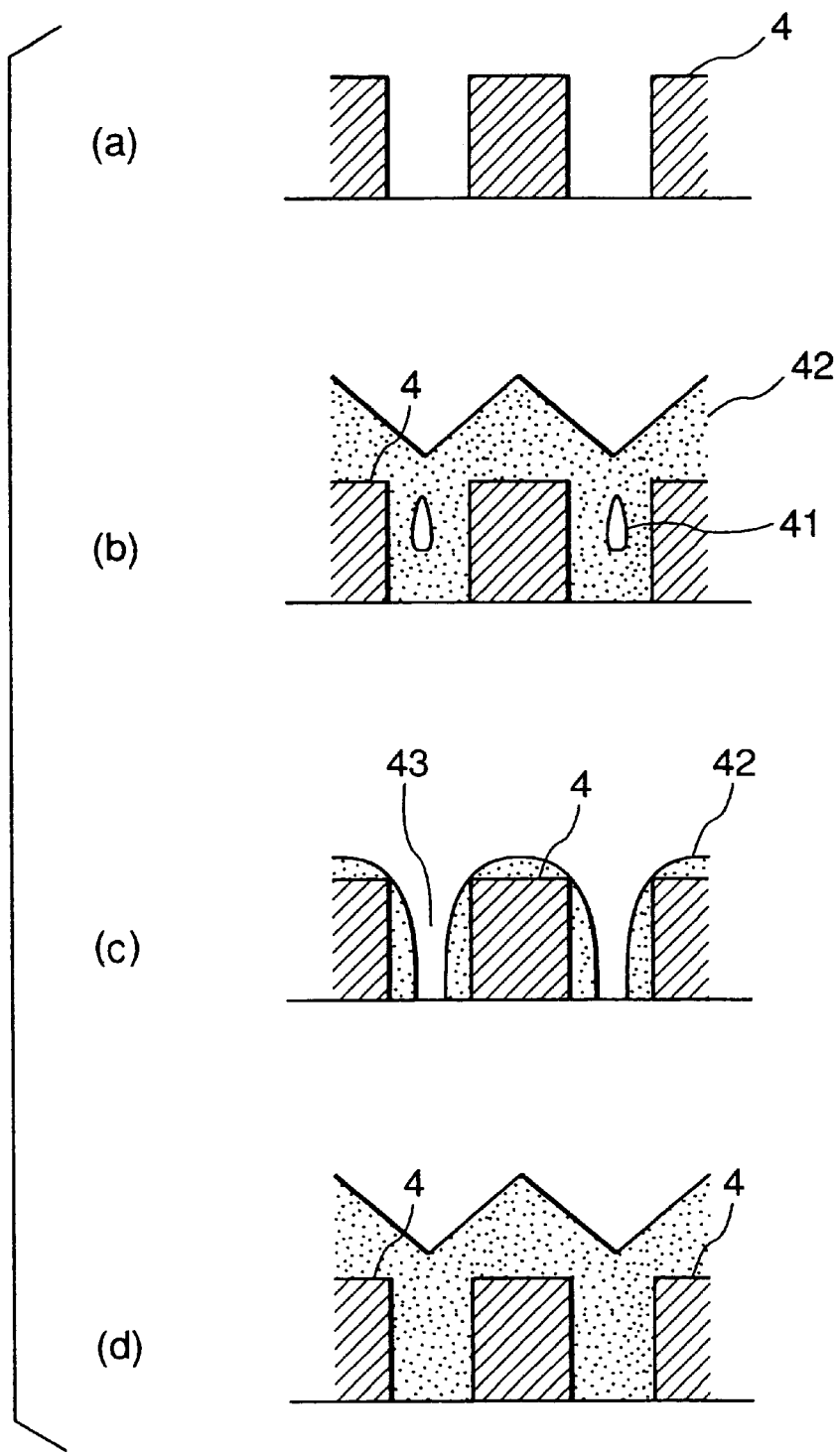
FIG. 21 is an explanatory view showing the embedded state between wirings by CF film.

FIG. 21 is a view showing the state where process is carried out by such a method, wherein FIG. 21(a) shows the state where aluminum wirings 4 are formed on, e.g., phosphorus or boron doped $SiO_2$ film. When film formation is carried out by $C_4F_8$ gas and $C_2H_4$ gas with respect to the surface, the portions between wirings 4 are buried by CF film 42 as shown in FIG. 21(b). In this case, when aspect ratio is large, voids 41 are formed.

Subsequently, when CF film 42 portions are etched by $O_2$ gas, CF films 42 remain at the side walls of the wiring 4 as shown in FIG. 21(C), and there results such a form that there are formed recessed portions 43 where the frontage side is wide and the depth portion is narrow. Thereafter, when film forming is carried out after undergone switching from $O_2$ gas to film forming gas for a second time, satisfactory embedding using no void is carried out as shown in FIG. 21(d).

The timing for carrying out switching from film forming gas to $O_2$ gas is not limited to that of this example, and may be, e.g., the timing when the frontage portion is about to be closed as shown in FIG. 20, or may be other timings. Further, switching between film forming gas and $O_2$ gas may be carried out twice or more during one process without being limited to one time as described above. In addition, when $O_2$ gas is delivered, film forming gas may be delivered at the same time.

In order to confirm the effect of such a method, the apparatus shown in FIG. 1 was used to deliver $C_4F_8$ gas and $C_2H_4$ gas at flow rates of 60 sccm and 30 sccm, respectively, for 60 seconds thereafter to carry out switching into $O_2$ gas 50 sccm to carry out etching for 60 sec to further carry out film forming for 120 sec. after undergone switching into $C_4F_8$ gas and $C_2H_4$ gas. Thus, satisfactory embedding may be carried out at the recessed portion between aluminum wirings in which the distance between wirings is 0.2 μm and the aspect ratio is 4.

In this experiment, the microwave power is set to 2700 W, the bias power of the mounting table is set to 1500 W, the pressure is set to 0.2 Pa and the surface temperature of the mounting table is 350° C., and other conditions are similar to those of the condition of the previously described embodiment.

Figure 22:
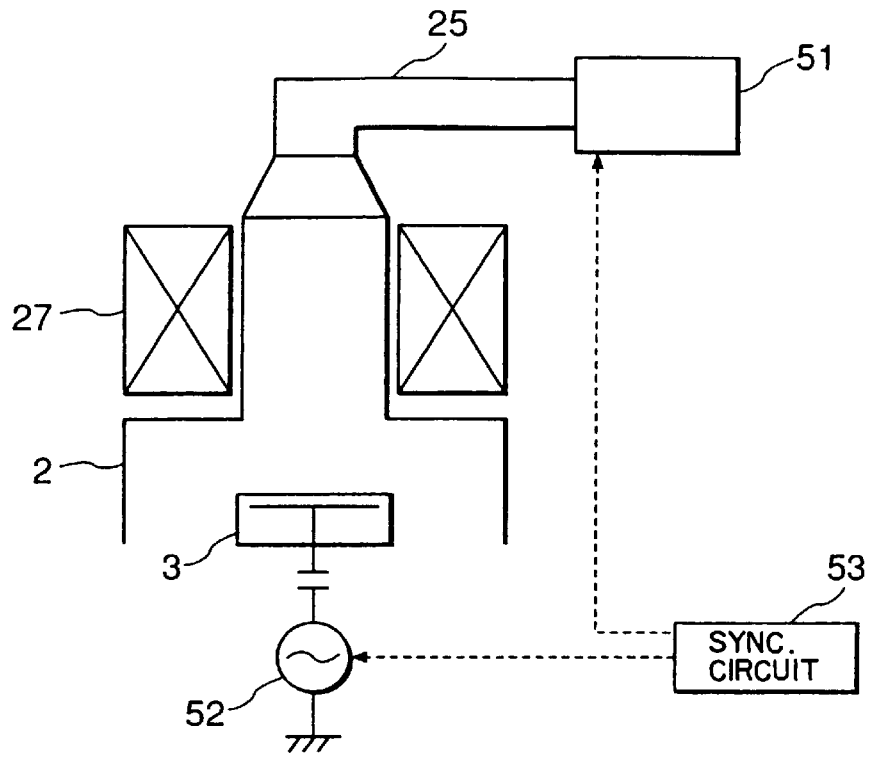
FIG. 22 is an explanatory view showing outline of the configuration of a plasma processing apparatus used in another embodiment of this invention.
Figure 23:
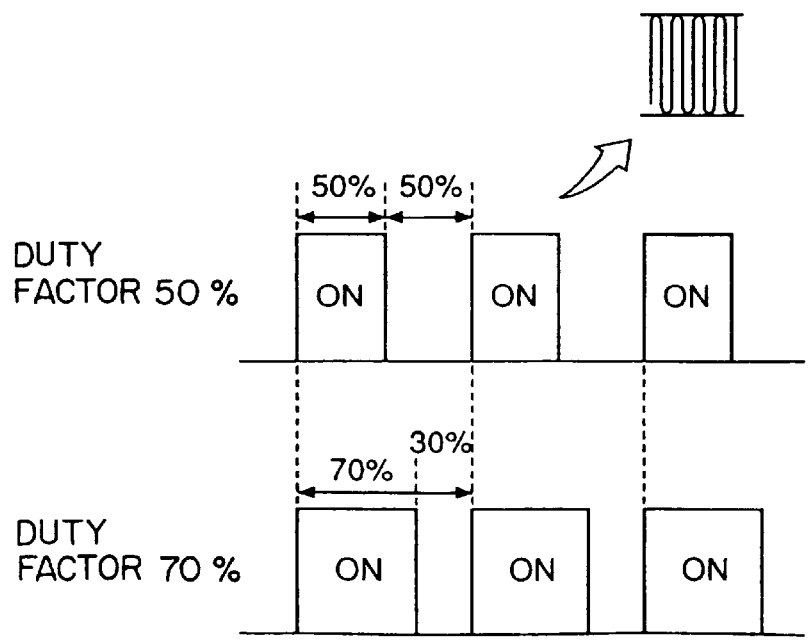
FIG. 23 is a waveform diagram showing the state where microwave power supply and bias power supply are turned ON or OFF.

Another embodiment of this invention will now be described. This embodiment is a method of applying, in a pulse form, electric energy for generating plasma with a certain duty factor. When explanation is given by taking the ECR plasma apparatus as an example, the apparatus is of the configuration in which a pulse microwave power supply 51 is used as microwave oscillating unit as shown in FIG. 22 and a pulse high frequency power supply 52 is used as bias power supply to the mounting table 3, and a synchronizing circuit 53 for synchronizing these power supplies 51, 52 is provided. In this example, the pulse microwave power supply 51 is a unit comprising high frequency power supply for outputting, e.g., microwave of 2.45 GHz and adapted for allowing microwave therefrom to be turned ON or OFF by, e.g., pulse of 10 Hz to 10 KHz outputted from the synchronizing circuit 53, and serves to modulate so-called microwave by pulse. Moreover, the pulse high frequency power supply 52 comprises high frequency power supply for outputting, e.g., high frequency power of 13.56 MHz and serves to allow the high frequency power therefrom to be turned ON or OFF to output it. An example of power waveforms of power supplies 51, 52 is shown in FIG. 23. Although pulse waveform is depicted in a model form in the figure, power waveform of 2.45 GHz (or 13.56 MHz) is included in practice when this pulse is in ON state.

Figure 24:
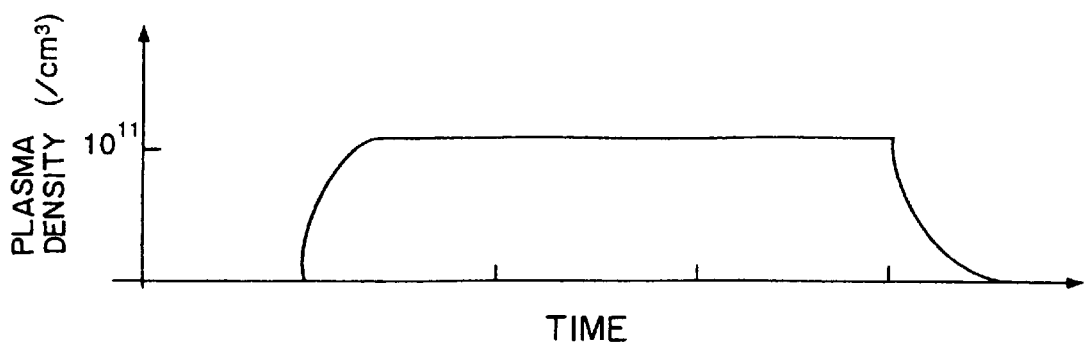
FIG. 24 is a characteristic diagram showing the relationship of microwave power, plasma density and electron temperature.
Figure 24:
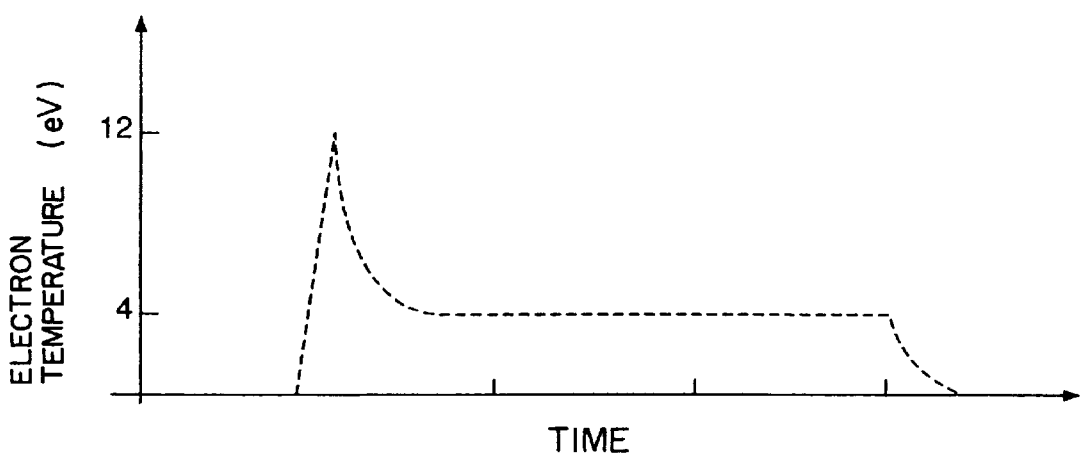
Figure 24:
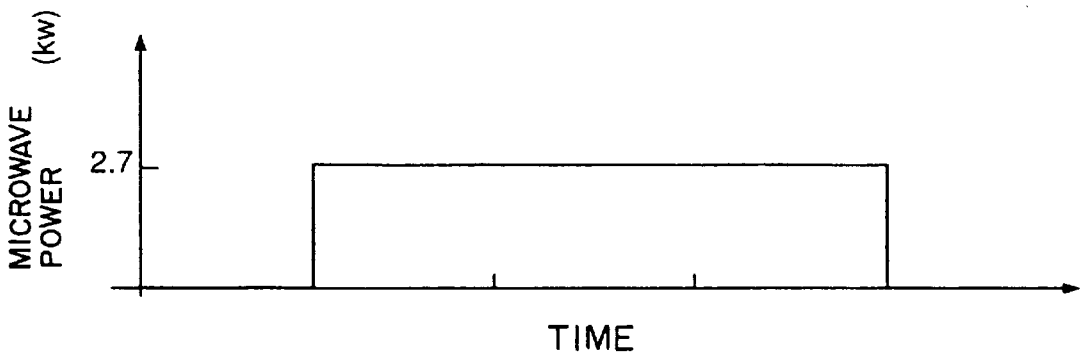

The merit by such method will now be described. When microwave is continuously oscillated as in the conventional method to produce plasma, electron temperature rapidly elevates at the time of start of oscillation. Further, electrons collide with molecules one after another by the avalanche phenomenon. As a result, temperature of electrons lowers from 12 ev to 4 ev in average, for example. Followed by this, plasma density is saturated so that, e.g., $10^{11}/cm^3$ is provided. Thus, stable state is realized. This state is shown in FIG. 24.

Figure 25:
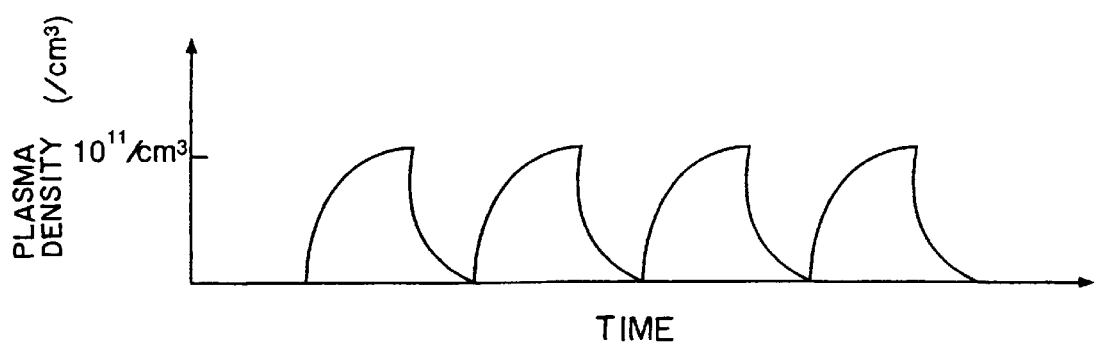
FIG. 25 is a characteristic diagram showing the relationship of microwave power, plasma density and electron temperature.
Figure 25:
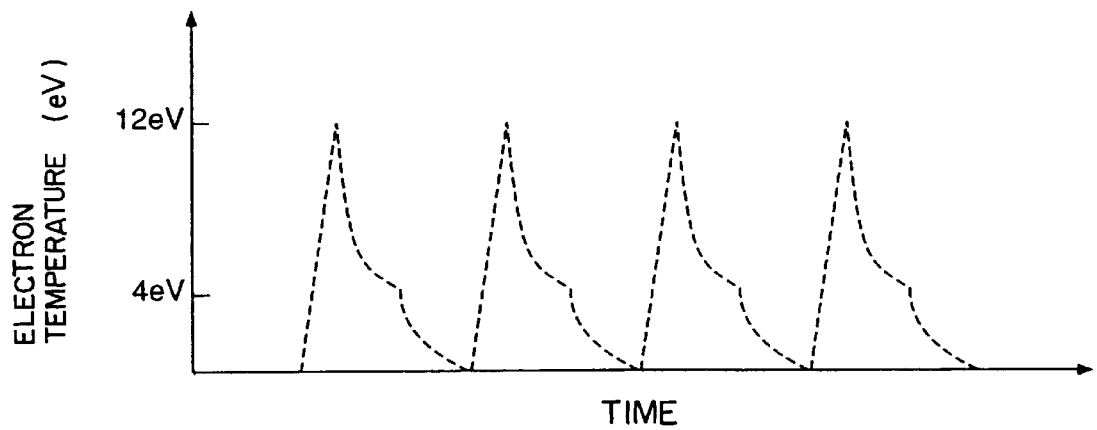
Figure 25:
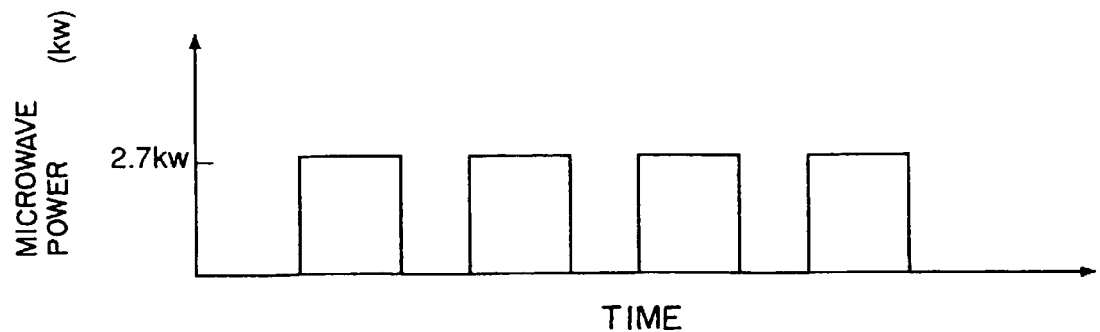

On the contrary, since the pulse oscillation repeats ON or OFF operation, initial transient phenomenon of continuous oscillation takes place every time pulse is turned ON. Accordingly, the state where electron temperature suddenly rises is continuously maintained. Such state is shown in FIG. 25. Electron temperature rises by employing pulse oscillation, and the number of radicals which become effective at the time of forming film, particularly the number of radicals of high energy is increased. As a result, when the film forming speed becomes high, and radicals are thrust into the depth portion of the film. Thus, fine film is provided.

Figure 26:
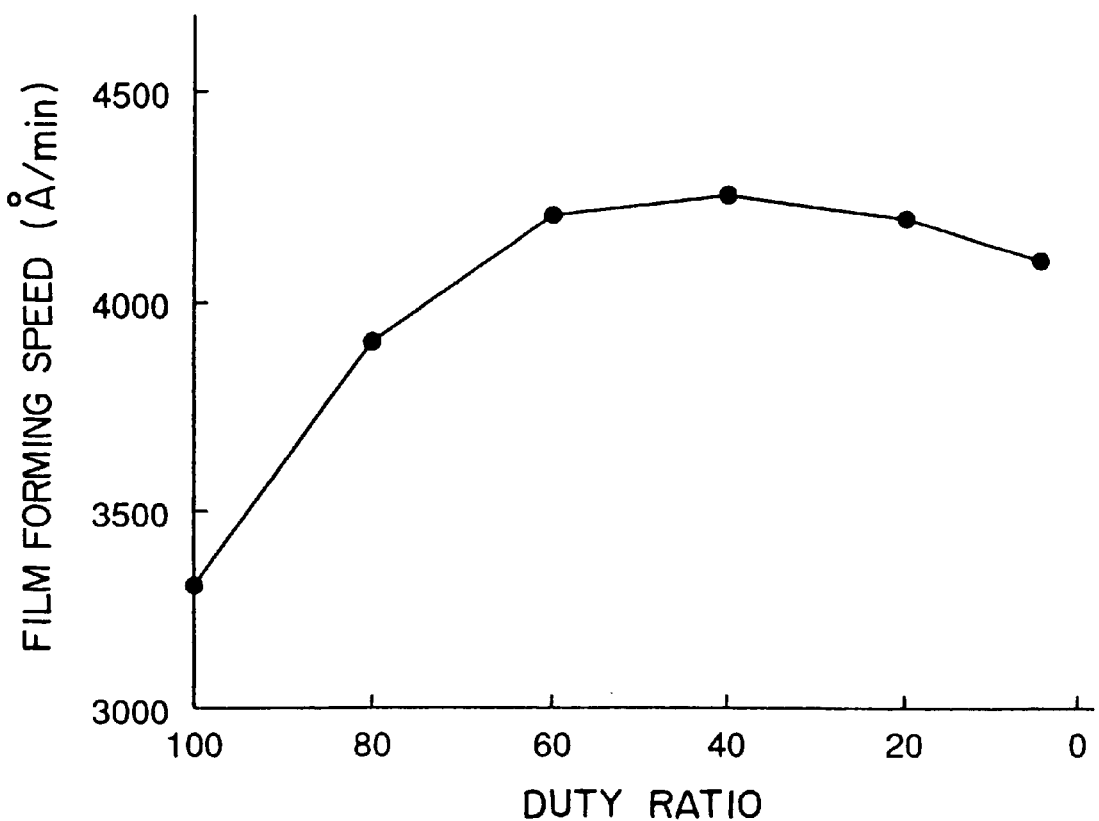
FIG. 26 is a characteristic diagram showing the relationship between duty factor when microwave power and bias power are turned ON or OFF and film forming speed.

As the result of the fact that film forming speed when $C_4F_8$ gas, $C_2H_4$ gas and Ar gas are delivered at 60 sccm, 30 sccm and 150 sccm, respectively, pulse frequencies of power supplies 51, 52 are set at 300 Hz and duty factor is changed in various manners is examined, result shown in FIG. 26 was obtained. With respect to other process conditions, microwave power and bias power are set at 2700 W and 1500 W, respectively, pressure is set at 0.2 Pa and the surface temperature of the mounting table is set at 320° C. In addition, other conditions are similar to those of the previously described embodiment.

According as the duty factor is lowered from 100% to 40% by making use of pulse plasma, it becomes possible to generate plasma having high electron temperature. As a result, energy of active species contributing to film formation is enhanced. Thus, the film forming speed is elevated.

When the duty factor is further lowered to 40% or less, lowering phenomenon of the film forming speed is observed. The reason thereof is as follows. It is considered that plasma having high electron temperature is generated simultaneously with application of pulse power, but pulse power is turned OFF before the avalanche phenomenon is sufficiently produced, so quantity produced of active species contributing to film formation is decreased. Accordingly, the duty factor is optimized, thereby making it possible to improve film forming speed.

As stated above, in the method of utilizing pulse plasma, high frequency power as in the conventional method may be applied with respect to application of bias power, and such a method may be applied to the case where formation of film except for CF film, e.g., $SiO_2$ film is carried out. In the above-described embodiments, this invention may be applied to plasma processing apparatuses except for ECR plasma processing apparatus.

As stated above, in accordance with this invention, e.g., CF film having good film quality suitable for interlayer insulating film can be formed, and high film forming speed is obtained.

What is claimed is:

1. A plasma film forming method for forming an interlayer insulating film for a semiconductor device having a multi-layer wiring structure, said method comprising:

preparing film forming gas including at least gas having a molecular structure in that four groups of carbon and fluorine are bonded to one carbon; and allowing the film forming gas to be placed in a plasma state to form an interlayer insulating film including a fluorine added carbon film.

2. The method as set forth in claim 1, wherein the prepared film forming gas is either $C(CF_3)_4$ or $C(C_2F_5)_4$ gas.

3. The method as set forth in claim 1, wherein the prepared film forming gas further includes either $C_4F_8$ or $C_2F_2$ gas.

4. A plasma film forming method for forming an interlayer insulating film for a semiconductor device having a multi-layer wiring structure, said method comprising the steps of:

preparing film forming gas including at least a gas selected among $CH_3(CH_2)_3CH_2F$ gas, $CH_3(CH_2)_4CH_2F$ gas, $CH_3(CH_2)_7CH_2F$ gas, $CHCH_3F_2$ gas, $CH_3F$ gas or $CH_2F_2$ gas; and allowing the film forming gas to be placed in a plasma state to form an interlayer insulating film including a fluorine added carbon film on the substrate.

5. The method as set forth in claim 4, wherein the prepared film forming gas further includes $C_kH_s$ and $C_nF_m$ gas where k, s, n and m are integers larger than zero.

6. A plasma film forming method for forming an interlayer insulating film for a semiconductor device having a multi-layer wiring structure, said method comprising the steps of:

allowing film forming gas including at least $C_kH_s$ and $C_nF_m$ gas and oxygen gas to be placed in a plasma state, where k, s, n and m are integers larger than zero; and forming an interlayer insulating film including a fluorine added carbon film on a substrate having a formed wiring pattern, by using the plasma state-film forming gas.

7. The method as set forth in claim 6, wherein the oxygen gas is supplied while the interlayer insulating film is being formed.

* * * * *